United States Patent
Sekine et al.

(10) Patent No.: US 9,786,678 B2
(45) Date of Patent: Oct. 10, 2017

(54) NONVOLATILE SEMICONDUCTOR MEMORY DEVICE AND METHOD OF MANUFACTURING THE SAME

(71) Applicant: TOSHIBA MEMORY CORPORATION, Minato-ku (JP)

(72) Inventors: Katsuyuki Sekine, Yokkaichi (JP); Masaaki Higuchi, Yokkaichi (JP); Masao Shingu, Yokkaichi (JP); Hirokazu Ishigaki, Yokkaichi (JP); Naoki Yasuda, Mie (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/798,891

(22) Filed: Jul. 14, 2015

(65) Prior Publication Data

US 2016/0079269 A1   Mar. 17, 2016

Related U.S. Application Data

(60) Provisional application No. 62/049,123, filed on Sep. 11, 2014.

(51) Int. Cl.
*H01L 27/11582* (2017.01)
*H01L 29/51* (2006.01)
(Continued)

(52) U.S. Cl.
CPC .... *H01L 27/11582* (2013.01); *H01L 21/0214* (2013.01); *H01L 21/0217* (2013.01);
(Continued)

(58) Field of Classification Search
CPC ......... H01L 27/11556; H01L 27/11582; H01L 29/511; H01L 29/518; H01L 29/7883; H01L 29/517
See application file for complete search history.

(56) References Cited

U.S. PATENT DOCUMENTS

2011/0193153 A1*  8/2011  Higuchi ............ H01L 27/11578
                                                              257/324
2012/0211820 A1   8/2012  Komori et al.
(Continued)

FOREIGN PATENT DOCUMENTS

JP    2012-174887 A    9/2012
JP    2012-195344 A   10/2012
(Continued)

OTHER PUBLICATIONS

U.S. Appl. No. 14/844,382, filed Sep. 3, 2015, Sonehara, et al.

*Primary Examiner* — Bilkis Jahan
*Assistant Examiner* — Victor Barzykin
(74) *Attorney, Agent, or Firm* — Oblon, McClelland, Maier & Neustadt, L.L.P.

(57) ABSTRACT

According to an embodiment, a nonvolatile semiconductor memory device comprises a plurality of conductive layers stacked in a first direction via an inter-layer insulating layer. In addition, the nonvolatile semiconductor memory device comprises: a semiconductor layer having the first direction as a longer direction; a tunnel insulating layer contacting a side surface of the semiconductor layer; a charge accumulation layer contacting a side surface of the tunnel insulating layer; and a block insulating layer contacting a portion facing the conductive layer, of a side surface of the charge accumulation layer. Moreover, the portion facing the conductive layer, of the charge accumulation layer is thinner compared to a portion facing the inter-layer insulating layer, of the charge accumulation layer.

20 Claims, 17 Drawing Sheets

(51) Int. Cl.
- *H01L 21/02* (2006.01)
- *H01L 27/1157* (2017.01)
- *H01L 27/11575* (2017.01)

(52) U.S. Cl.
CPC ...... *H01L 21/0223* (2013.01); *H01L 27/1157* (2013.01); *H01L 27/11575* (2013.01); *H01L 29/511* (2013.01); *H01L 29/518* (2013.01)

(56) References Cited

U.S. PATENT DOCUMENTS

| | | |
|---|---|---|
| 2012/0235220 A1 | 9/2012 | Sekine et al. |
| 2013/0228853 A1 | 9/2013 | Higuchi et al. |
| 2013/0270643 A1* | 10/2013 | Lee .................. H01L 27/1052 257/365 |
| 2013/0341703 A1 | 12/2013 | Shinohara et al. |

FOREIGN PATENT DOCUMENTS

| | | |
|---|---|---|
| JP | 2013-120786 A | 6/2013 |
| JP | 2014-3232 A | 1/2014 |

\* cited by examiner

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of U.S. Provisional Patent Application No. 62/049,123, filed on Sep. 11, 2014, the entire contents of which are incorporated herein by reference.

FIELD

Embodiments described here relate to a nonvolatile semiconductor memory device and a method of manufacturing the same.

BACKGROUND

Description of the Related Art

A memory cell configuring a nonvolatile semiconductor memory device such as a NAND type flash memory includes a semiconductor layer, a control gate, and a charge accumulation layer. The memory cell changes its threshold voltage according to a charge accumulated in the charge accumulation layer and stores a magnitude of this threshold voltage as data. In recent years, enlargement of capacity and raising of integration level has been proceeding in such a nonvolatile semiconductor memory device. Moreover, a nonvolatile semiconductor memory device in which the memory cells are three-dimensionally disposed (a three-dimensional type semiconductor memory device) has been proposed to raise integration level of the memory.

DETAILED DESCRIPTION

A nonvolatile semiconductor memory device according to an embodiment described below comprises a plurality of conductive layers stacked in a first direction via an inter-layer insulating layer. In addition, the nonvolatile semiconductor memory device comprises: a semiconductor layer having the first direction as a longer direction; a tunnel insulating layer contacting a side surface of the semiconductor layer; a charge accumulation layer contacting a side surface of the tunnel insulating layer; and a block insulating layer contacting a portion facing the conductive layer, of a side surface of the charge accumulation layer. Moreover, the portion facing the conductive layer, of the charge accumulation layer is thinner compared to a portion facing the inter-layer insulating layer, of the charge accumulation layer.

Next, nonvolatile semiconductor memory devices according to embodiments will be described in detail with reference to the drawings. Note that these embodiments are merely examples, and are not shown with the intention of limiting the present invention. For example, the nonvolatile semiconductor memory device described below has a structure in which a memory string extends linearly in a perpendicular direction to a substrate. However, the present invention may be applied also to a device in which a memory string has a U shape doubling back on an opposite side midway. Moreover, each of the drawings of the nonvolatile semiconductor memory devices employed in the embodiments below is schematic, and the likes of thickness, width, and proportion of layers are different from those of the actual devices.

The embodiments below relate to a nonvolatile semiconductor memory device having a structure in which a plurality of MONOS (Metal-Oxide-Nitride-Oxide-Semiconductor) type memory cells (transistors) are provided in a height direction, the MONOS type memory cells including a semiconductor layer acting as a channel provided in a column shape perpendicularly to a substrate, and a gate electrode layer provided on a side surface of the semiconductor layer via a charge accumulation layer. However, this is also not intended to limit the present invention, and the present invention may be applied also to a memory cell of another form of charge accumulation layer, for example, a SONOS (Semiconductor-Oxide-Nitride-Oxide-Semiconductor) type memory cell, or a floating gate type memory cell, and so on.

[First Embodiment]

Figure 1:
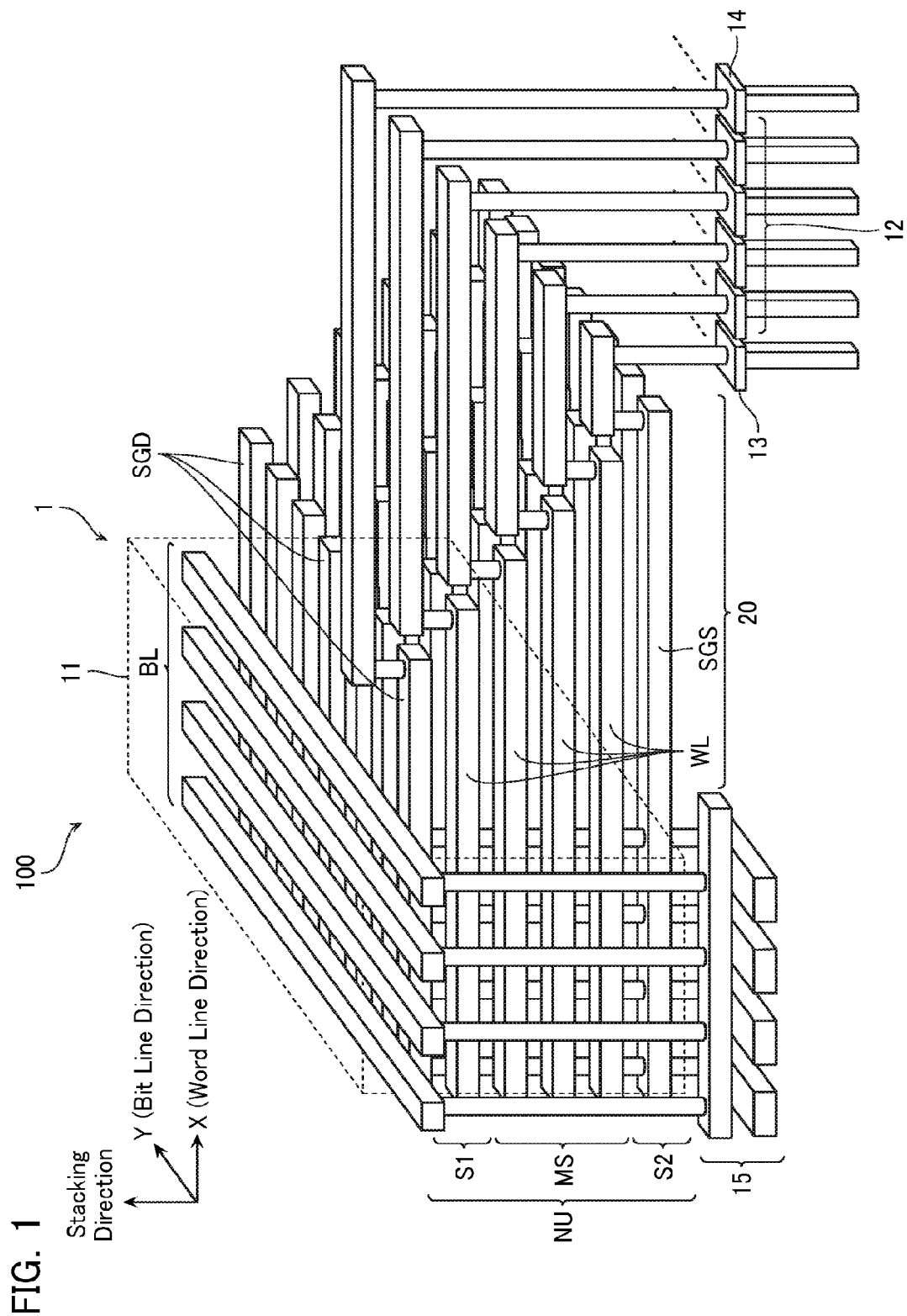
FIG. 1 is a perspective view showing a schematic configuration of a nonvolatile semiconductor memory device according to a first embodiment.

FIG. 1 is a perspective view showing schematically an example of structure of a nonvolatile semiconductor memory device 100 of a first embodiment. The nonvolatile semiconductor memory device 100 includes a memory cell array 11, a word line drive circuit 12, a source side select gate line drive circuit 13, a drain side select gate line drive circuit 14, a sense amplifier 15, a word line WL, a source side select gate line SGS, a drain side select gate line SGD, a bit line BL, a wiring line portion 20, and so on.

The memory cell array 11 comprises, on a semiconductor substrate (not illustrated in FIG. 1), a memory string MS configured having a plurality of memory cells MC (memory transistors) connected in series therein, and a drain side select transistor S1 and source side select transistor S2 respectively connected to both ends of the memory string MS. Note that the memory string MS and the drain side select transistor S1 and source side select transistor S2 connected to both ends thereof are referred to below as a "NAND cell unit NU".

As will be mentioned later, the memory cell MC has a structure in which a control gate electrode (word line) is provided on a side surface of a columnar semiconductor layer forming a channel, via a memory layer including a charge accumulation layer; and the drain side select transistor and source side select transistor have a structure in which a select gate electrode (select gate line) is provided on a side surface of the columnar semiconductor layer, via the memory layer including a charge accumulation layer. To simplify illustration, FIG. 1 exemplifies the case where four memory cells MC are provided in one memory string MS, but the number of memory cells MC in one memory string MS is of course not limited to four.

The word lines WL are commonly connected to the memory cells adjacent in an X direction (word line direction) in FIG. 1. Moreover, the source side select gate lines SGS are commonly connected to the source side select transistors S2 adjacent in the word line direction, and the drain side select gate lines SGD are commonly connected to the drain side select transistors Si adjacent in the word line direction. Note that in the description below, the source side select gate lines SGS and drain side select gate lines SGD are sometimes collectively referred to simply as "select gate lines". Moreover, the source side select transistors and drain side select transistors are sometimes collectively referred to simply as "select transistors". Note that one or a plurality of the memory cells MC in close proximity to the source side select gate line SGS and drain side select gate line SGD, of the memory cells MC in the memory string MS, are sometimes treated as dummy cells that are not employed in data storage. The examples described below also describe the case where one dummy cell is provided at each of both ends of the memory string MS, but it is not intended to limit to this case, and there may be two or more dummy cells, moreover, the dummy cells may also be omitted.

Furthermore, the bit lines BL are arranged so as to extend having as a longer direction a Y direction (bit line direction) intersecting the X direction (word line direction), and are arranged with a certain pitch in the X direction. The bit line BL is connected to a plurality of the memory strings MS via the drain side select transistor S1. Source lines SL are similarly arranged having the Y direction as a longer direction and are connected to the memory string MS via the source side select transistor S2, although this is omitted from illustration in FIG. 1.

The word line drive circuit 12 is a circuit that controls a voltage applied to the word line WL; the source side select gate line drive circuit 13 is a circuit that controls a voltage applied to the source side select gate line SGS; and the drain side select gate line drive circuit 14 is a circuit that controls a voltage applied to the drain side select gate line SGD. Moreover, the sense amplifier 15 is a circuit that amplifies a signal (voltage) read in the bit line BL from a selected memory cell.

The wiring line portion 20 is a wiring line portion for connecting the word lines WL and select gate lines SGS and SGD to a contact. The word lines WL and select gate lines SGS and SGD have a structure processed in a stepped shape, so as to be able to be independently connected to the contact at their respective upper portions.

Figure 2:
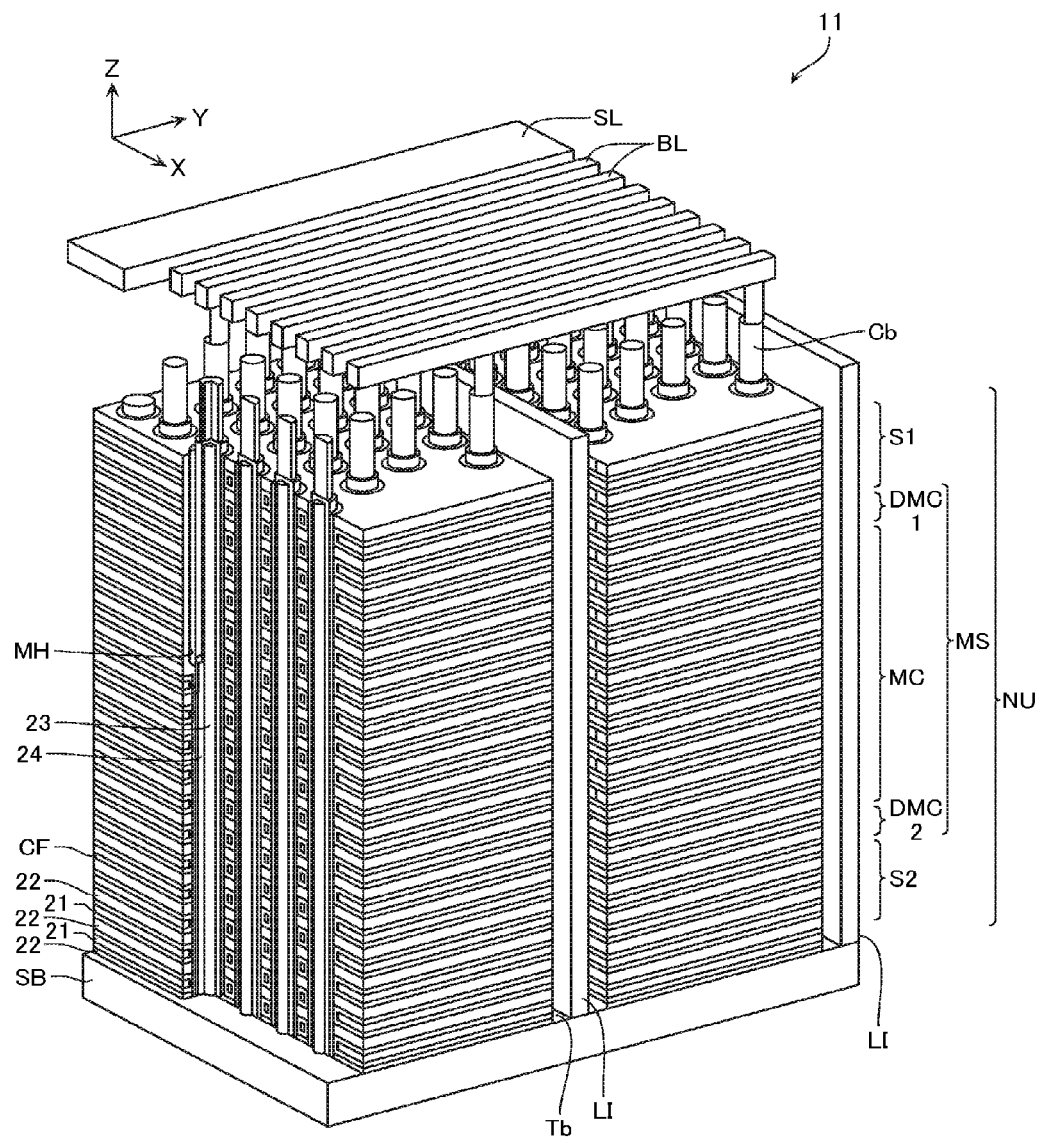
FIG. 2 is a perspective view showing a configuration of part of the same nonvolatile semiconductor memory device.
Figure 3:
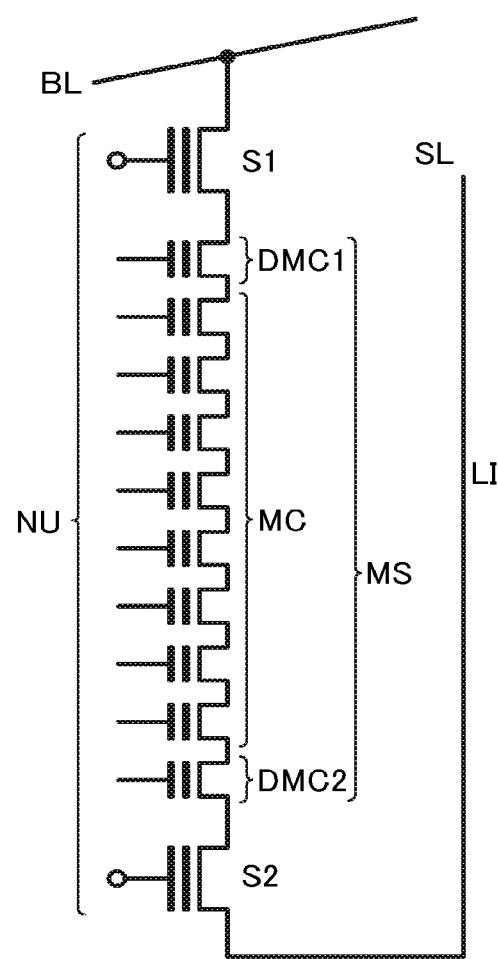
FIG. 3 is a circuit diagram showing a configuration of part of the same nonvolatile semiconductor memory device.
Figure 4:
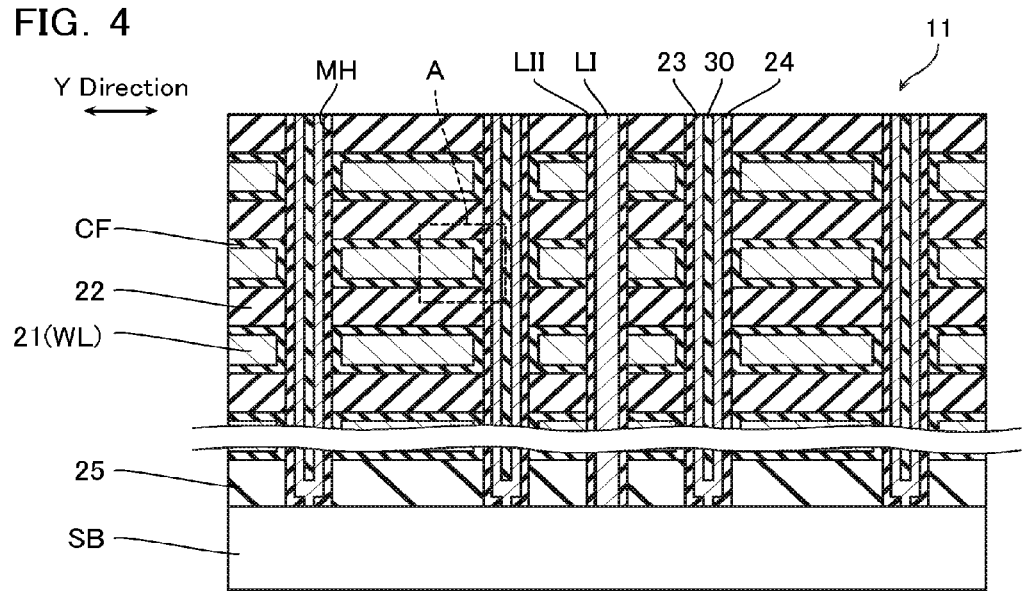
FIG. 4 is a schematic cross-sectional view showing a configuration of part of the same nonvolatile semiconductor memory device.

Next, details of structure of the memory cell array 11 will be described with reference to FIGS. 2 to 5. FIG. 2 is a perspective view showing a structure of part of the memory cell array 11; and FIG. 3 is an equivalent circuit diagram of one NAND cell unit NU. FIG. 4 is a cross-sectional view of the memory cell array 11; and FIG. 5 is an enlarged view of a portion indicated by A of FIG. 4.

As shown in FIG. 2, the memory cell array 11 has a structure in which inter-layer insulating layers 22 and conductive layers 21 are stacked alternately on a semiconductor substrate SB. This conductive layer 21 functions as a control gate of the memory cell MC (word line WL), as the source side select gate line SGS, and as the drain side select gate line SGD. The inter-layer insulating layer 22 is disposed above and below these conductive layers 21, and electrically insulates fellow conductive layers 21.

The conductive layer 21 may be formed by, for example, tungsten (W), tungsten nitride (WN), tungsten silicide (WSix), tantalum (Ta), tantalum nitride (TaN), tantalum silicide (TaSix), palladium silicide (PdSix), erbium silicide (ErSix), yttrium silicide (YSix), platinum silicide (PtSix), hafnium silicide (HfSix), nickel silicide (NiSix), cobalt silicide (CoSix), titanium silicide (TiSix), vanadium silicide (VSix), chromium silicide (CrSix), manganese silicide (MnSix), iron silicide (FeSix), ruthenium (Ru), molybdenum (Mo), titanium (Ti), titanium nitride (TiN), vanadium (V), chromium (Cr), manganese (Mn), iron (Fe), cobalt (Co), nickel (Ni), gold (Au), silver (Ag), or copper (Cu), or a compound thereof, but may be formed by polysilicon to which an impurity has been added.

Figure 5:
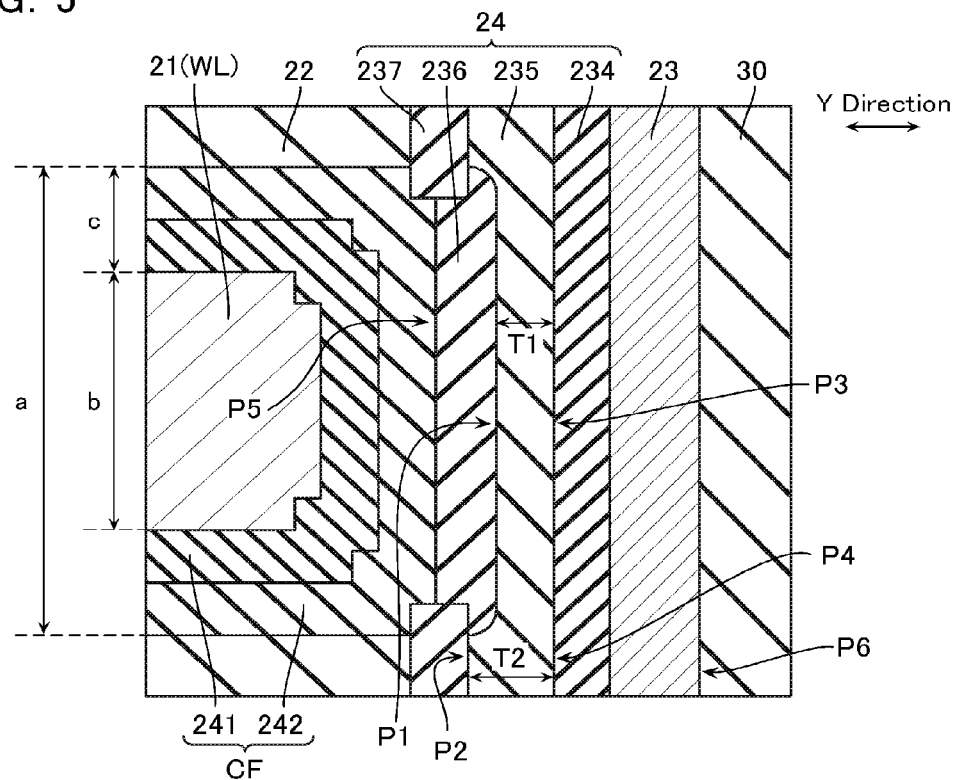
FIG. 5 is a schematic cross-sectional view showing a configuration of part of the same nonvolatile semiconductor memory device.

As shown in FIGS. 4 and 5, a stacked film CF is formed in a periphery of the conductive layer 21. The stacked film CF is configured from a block high dielectric layer 242 and a barrier metal 241. This will be described later.

Moreover, as shown in FIG. 2, a memory hole MH is formed in such an inter-layer insulating layer 22 and conductive layer 21 so as to penetrate a stacked body of the inter-layer insulating layer 22 and conductive layer 21. The memory holes MH are arranged with a certain pitch in an XY plane. Moreover, formed in the memory hole MH is a semiconductor layer 23 having the stacking direction (a Z direction) as a longer direction. As will be mentioned later, the semiconductor layer 23 is configured from the likes of polysilicon. Moreover, the semiconductor layer 23 is covered by a memory layer 24. The memory layer 24 may be formed from a stacked structure of a charge accumulation layer of the likes of a silicon nitride layer, and an oxide layer of the likes of a silicon oxide layer. A threshold voltage of the memory cell MC changes by an accumulated amount of charge to this charge accumulation layer, and the memory cell MC stores data corresponding to this threshold voltage.

The semiconductor layer 23 is connected to the bit line BL via a contact Cb at an upper end of the semiconductor layer 23. The bit lines BL are arranged with a certain pitch in the X direction, and have the Y direction as a longer direction.

Moreover, a lower end of the semiconductor layer 23 is connected to the semiconductor substrate SB. As will be mentioned later, the lower end of the semiconductor layer 23 is connected to the source line SL via this semiconductor substrate SB and a later-described source contact LI. The source lines SL are arranged having the Y direction as a longer direction, similarly to the bit lines BL.

Note that the stacked body of the inter-layer insulating layer 22 and conductive layer 21 in the memory cell array 11 is divided on a block basis, the block being a minimum unit of data erase. A trench Tb is formed at a boundary of division, and this trench Tb has an inter-layer insulating layer LII (FIG. 4) implanted therein, and has the previously-mentioned source contact LI further formed therein penetrating the inter-layer insulating layer LII. This source contact LI has its lower end connected to the semiconductor substrate SB and its upper end connected to the source line SL.

FIG. 3 is an equivalent circuit diagram of one NAND cell unit NU. In this memory cell array 11, one NAND cell unit NU comprises: the memory string MS configured from a plurality of the memory cells MC, a dummy cell DMC1, and a dummy cell DMC2; the drain side select transistor S1 connected between an upper end of the memory string MS and the bit line BL; and the source side select transistor S2 connected between a lower end of the memory string MS and the source line SL.

As shown in FIG. 4, formed in the memory hole MH, sequentially from a center thereof, are a core insulating layer 30, the semiconductor layer 23, and the memory layer 24.

Moreover, as shown in FIG. 5, the memory layer 24 comprises: a tunnel insulating layer 234 that contacts a side surface of the semiconductor layer 23; a charge accumulation layer 235 that contacts a side surface of the tunnel insulating layer 234; and a block insulating layer 236 and cover insulating layer 237 that contact a side surface of the charge accumulation layer 235. The block insulating layer 236 covers a portion P1 facing the conductive layer 21 (word line WL), of the side surface of the charge accumulation layer 235. Moreover, a plurality of the block insulating layers 236 are formed in the stacking direction and respectively face side surfaces of a plurality of the conductive layers 21. The cover insulating layer 237 covers a portion P2 facing the inter-layer insulating layer 22, of the side surface of the charge accumulation layer 235. Furthermore, in the present embodiment, a film thickness T1 of a portion P3 facing the conductive layer 21 of the charge accumulation layer 235 is smaller compared to a film thickness T2 of a portion P4 facing the inter-layer insulating layer 22 of the charge accumulation layer 235.

Note that the tunnel insulating layer 234, the block insulating layer 236, and the cover insulating layer 237 are formed from, for example, silicon oxide ($SiO_2$). Moreover, the charge accumulation layer 235 is formed from, for example, silicon nitride (SiN).

In addition, as shown in FIG. 5, the stacked film CF covering the conductive layer 21 includes the block high dielectric layer 242 and the barrier metal 241. The stacked film CF contacts the inter-layer insulating layer 22 at an upper surface and a lower surface of the stacked film CF, and contacts the block insulating layer 236 at a side surface facing the semiconductor layer 23, of the stacked film CF. Note that the block high dielectric layer 242 is formed from, for example, a metal oxide such as alumina ($Al_2O_3$) or a hafnium oxide ($HfO_x$). Moreover, the barrier metal 241 is formed from, for example, a metal nitride such as TiN, WN, or TaN.

In the nonvolatile semiconductor memory device according to the present embodiment, the film thickness T1 of the portion P3 facing the word line WL of the charge accumulation layer 235 is thinner compared to the film thickness T2 of the portion P4 facing the inter-layer insulating layer 22 of the charge accumulation layer 235. In such a nonvolatile semiconductor memory device, this unevenness makes it possible to suppress migration of charge in the charge accumulation layer 235 and improve data storage characteristics.

Moreover, in the nonvolatile semiconductor memory device according to the present embodiment, the block insulating layer 236 covers a side surface of the word line WL, and does not cover an upper surface and a lower surface of the word line WL. Therefore, as will be described later, it is possible to increase a film thickness "b" of the word line WL to reduce a resistance value of the word line WL and improve operation speed, while suitably maintaining insulation properties between the word line WL and the charge accumulation layer 235. Moreover, it is possible to reduce size in the stacking direction of the memory cell array 11, while suitably maintaining insulation properties between the word line WL and the charge accumulation layer 235.

In addition, by improving a fringe electric field and making it easier to form a channel in a portion P6 facing the inter-layer insulating layer 22 of the semiconductor layer 23, the nonvolatile semiconductor memory device according to the present embodiment makes it possible to reduce read failure accompanying an increase in cell current.

[Method of Manufacturing]

Next, a method of manufacturing the nonvolatile semiconductor memory device according to the first embodiment will be described with reference to FIGS. 6 to 18. FIGS. 6 to 18 are cross-sectional views for explaining the method of manufacturing according to the first embodiment.

Figure 6:
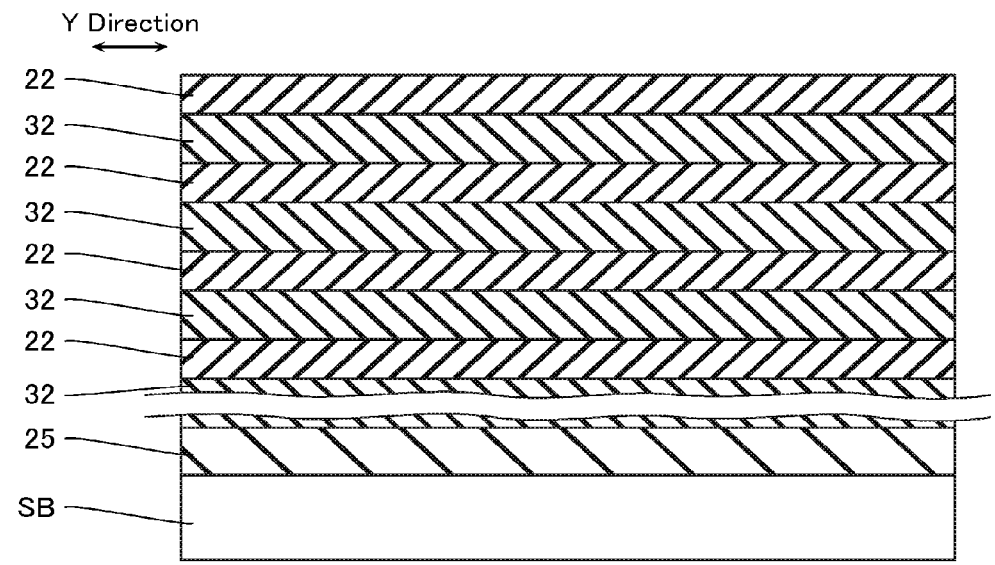
FIG. 6 is a schematic cross-sectional view showing a manufacturing process of the same nonvolatile semiconductor memory device.

As shown in FIG. 6, an insulating layer 25 is stacked on the semiconductor substrate SB. In addition, a plurality of sacrifice layers 32 and the inter-layer insulating layers 22 are stacked alternately on the insulating layer 25. Note that the insulating layer 25 and the inter-layer insulating layer 22 are formed from, for example, silicon oxide ($SiO_2$). Moreover, the sacrifice layer 32 is formed from, for example, silicon nitride (SiN).

Figure 7:
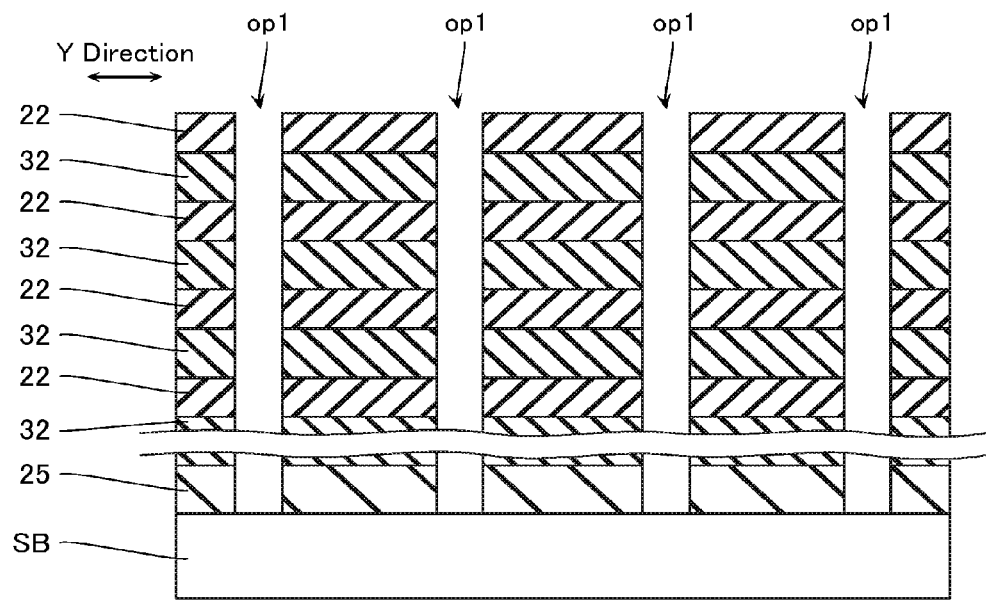
FIG. 7 is a schematic cross-sectional view showing a manufacturing process of the same nonvolatile semiconductor memory device.

Next, as shown in FIG. 7, an opening op1 penetrating the insulating layer 25, the sacrifice layer 32, and the inter-layer insulating layer 22 is formed. The opening op1 will be the memory hole MH.

Figure 8:
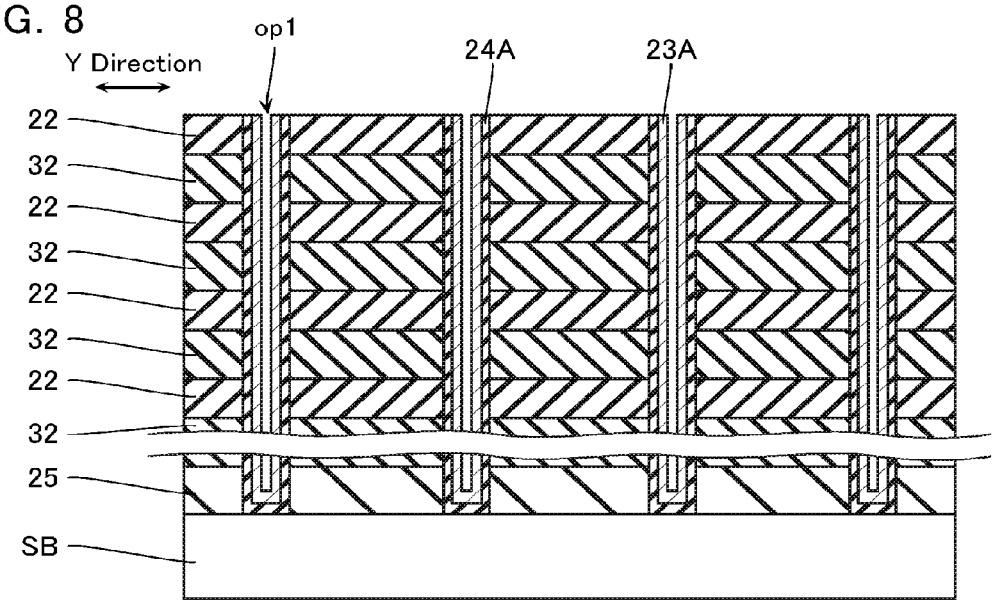
FIG. 8 is a schematic cross-sectional view showing a manufacturing process of the same nonvolatile semiconductor memory device.
Figure 9:
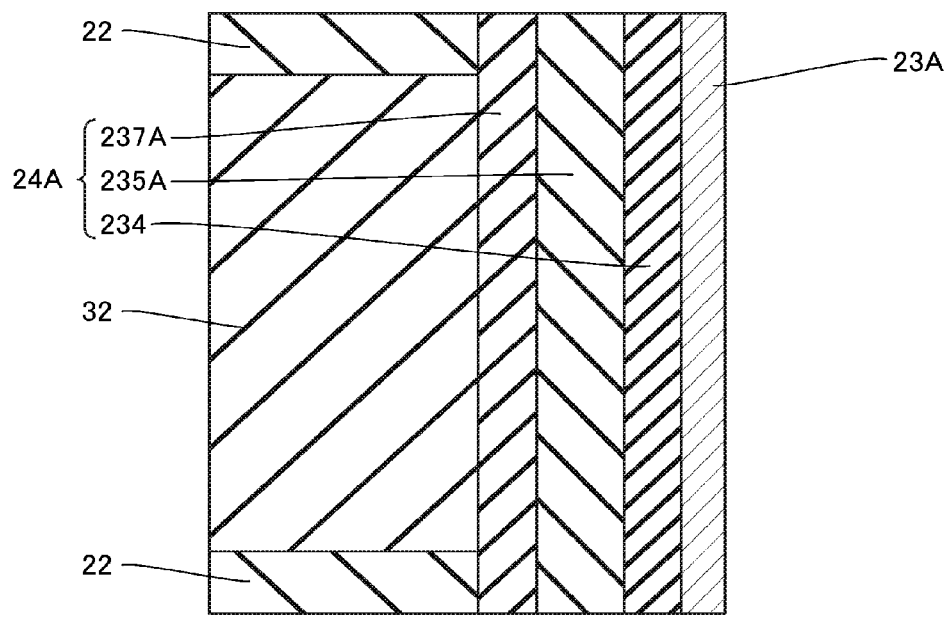
FIG. 9 is a schematic cross-sectional view showing a manufacturing process of the same nonvolatile semiconductor memory device.

Next, as shown in FIGS. 8 and 9, a memory layer formation layer 24A which will be the memory layer 24 and a semiconductor layer formation layer 23A which will be the semiconductor layer 23 are formed in the opening op1. As shown in FIG. 9, formation of the memory layer formation layer 24A is performed by sequentially forming a sacrifice layer 237A which will be the cover insulating layer 237, a charge accumulation layer formation layer 235A which will be the charge accumulation layer 235, and the tunnel insulating layer 234. Note that the sacrifice layer 237A and the tunnel insulating layer 234 are formed from, for example, silicon oxide ($SiO_2$). Moreover, the charge accumulation layer formation layer 235A is formed from, for example, silicon nitride (SiN). Moreover, the semiconductor layer formation layer 23A is formed from, for example, polysilicon. Note that the tunnel insulating layer 234 may be a stacked structure of silicon oxide ($SiO_2$) and silicon nitride (SiN) or a film including silicon oxynitride (SiON).

Figure 10:
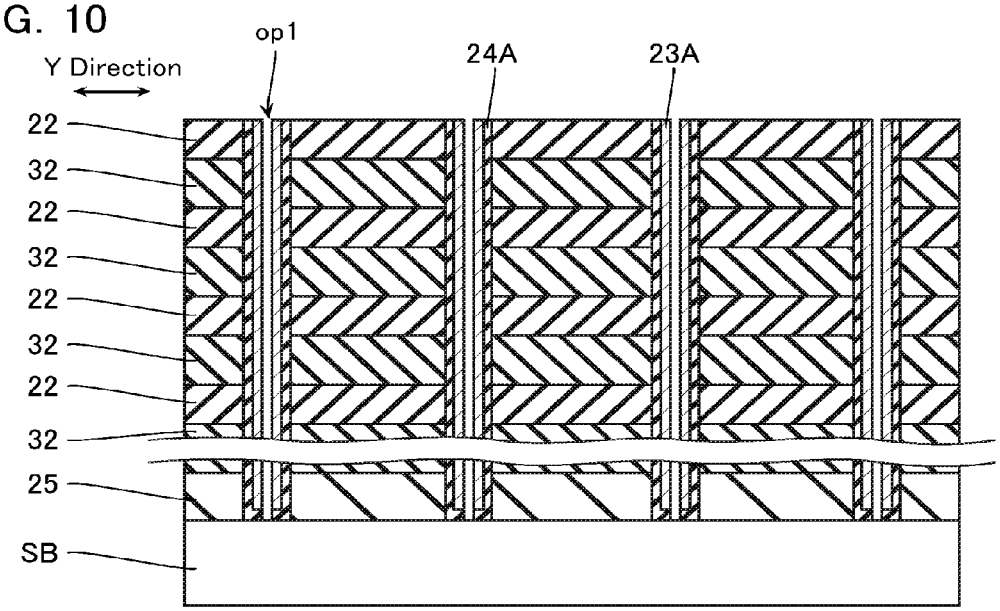
FIG. 10 is a schematic cross-sectional view showing a manufacturing process of the same nonvolatile semiconductor memory device.

Next, as shown in FIG. 10, the memory layer formation layer 24A and the semiconductor layer formation layer 23A are removed at the bottom of the opening op1.

Figure 11:
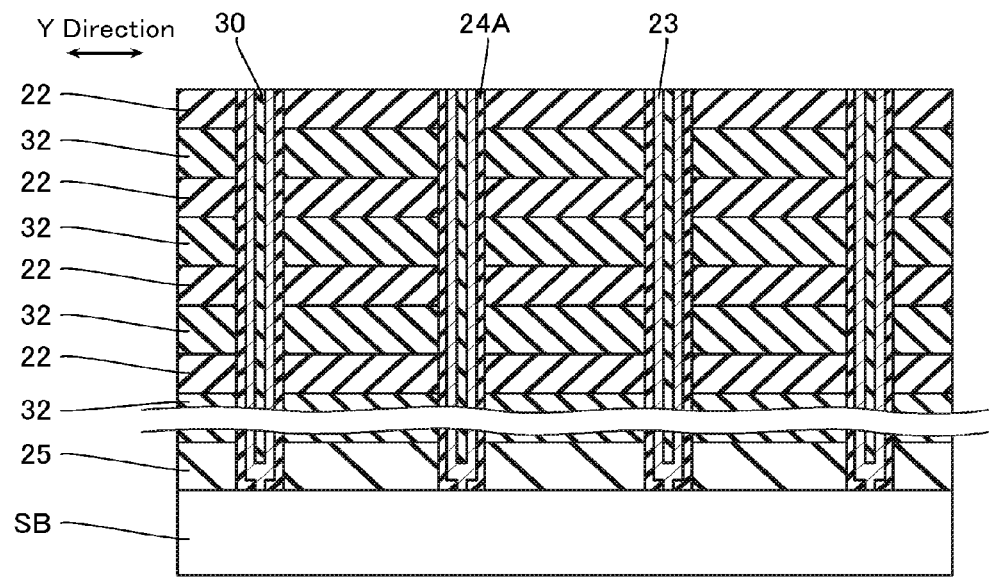
FIG. 11 is a schematic cross-sectional view showing a manufacturing process of the same nonvolatile semiconductor memory device.
Figure 12:
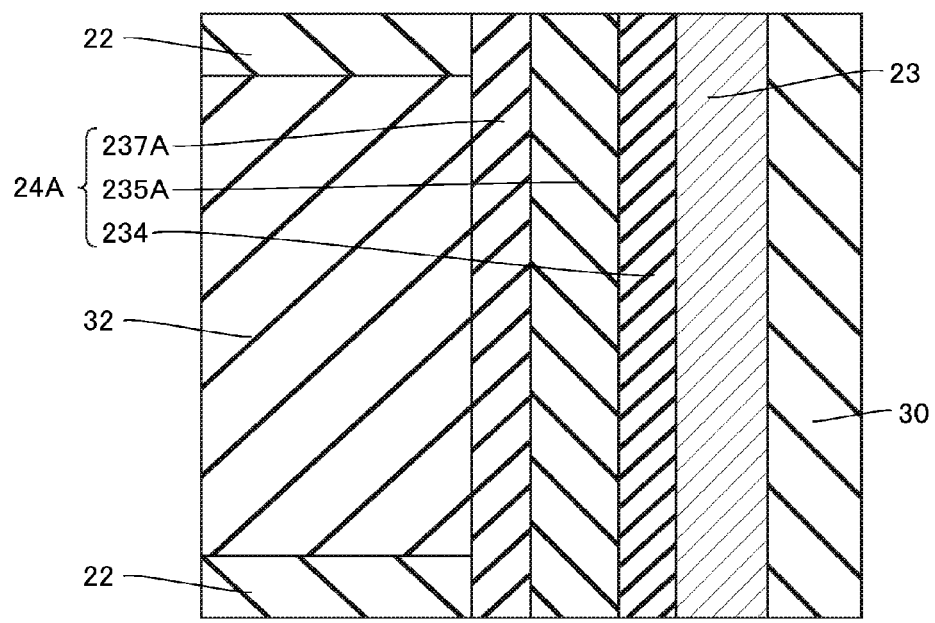
FIG. 12 is a schematic cross-sectional view showing a manufacturing process of the same nonvolatile semiconductor memory device.

Next, as shown in FIGS. 11 and 12, a semiconductor and the core insulating layer 30 are further formed in the opening op1. As a result, the semiconductor layer 23 electrically connected to the semiconductor substrate SB is formed. The core insulating layer 30 is formed from, for example, silicon oxide ($SiO_2$).

Figure 13:
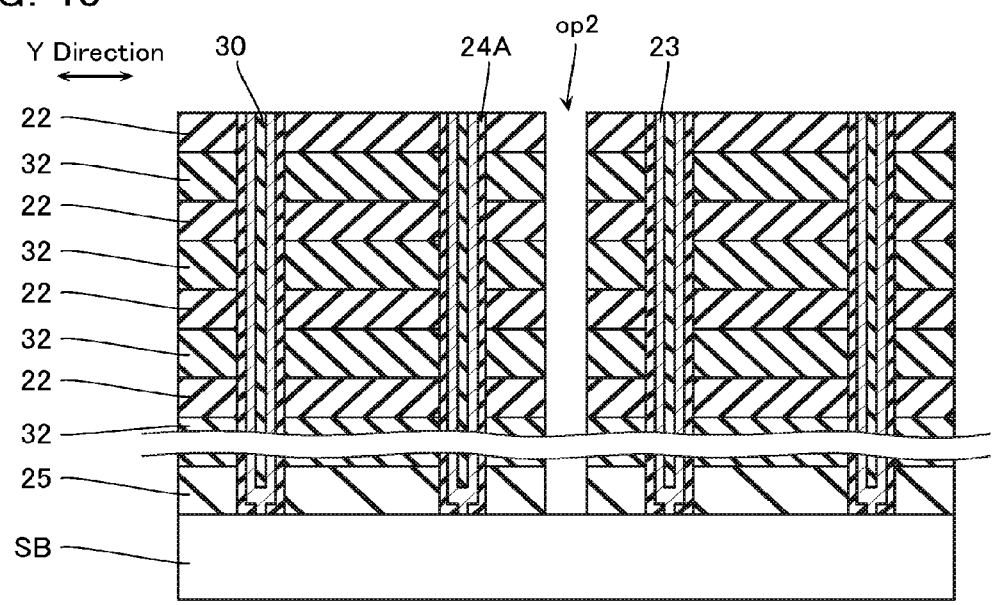
FIG. 13 is a schematic cross-sectional view showing a manufacturing process of the same nonvolatile semiconductor memory device.

Next, as shown in FIG. 13, an opening op2 dividing the insulating layer 25, the sacrifice layer 32, and the inter-layer insulating layer 22 is formed. The opening op2 will be the trench Tb.

Figure 14:
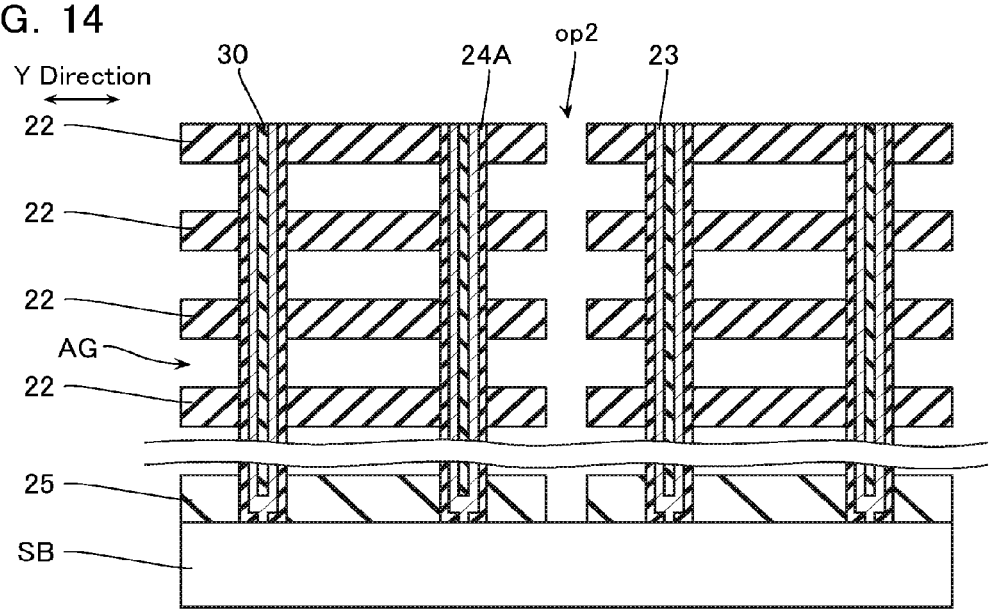
FIG. 14 is a schematic cross-sectional view showing a manufacturing process of the same nonvolatile semiconductor memory device.
Figure 15:
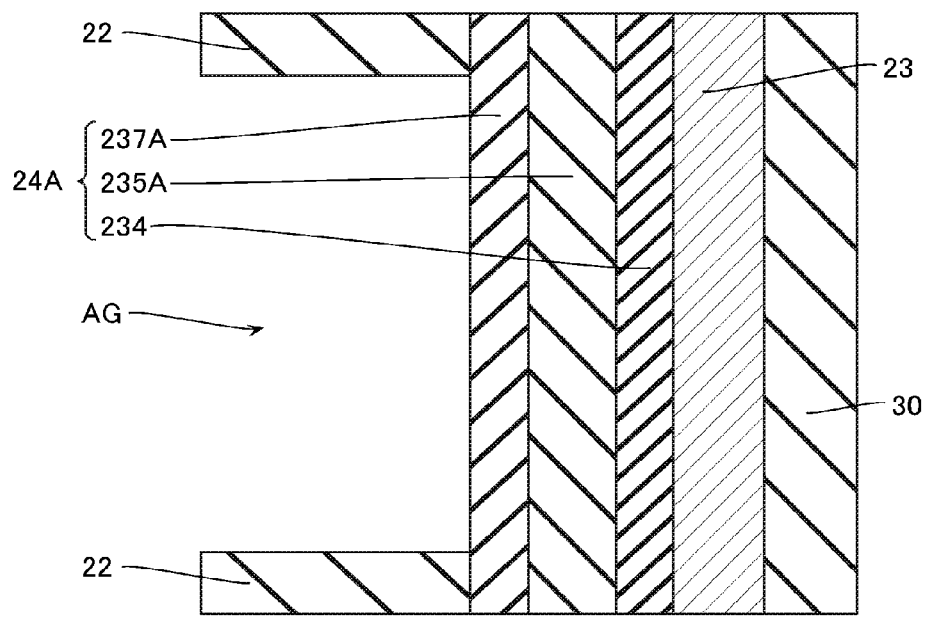
FIG. 15 is a schematic cross-sectional view showing a manufacturing process of the same nonvolatile semiconductor memory device.

Next, as shown in FIGS. 14 and 15, the sacrifice layer 32 is removed via the opening op2. Removal of the sacrifice layer 32 is performed by, for example, wet etching using a phosphoric acid solution. As a result, as shown in FIG. 15, an air gap AG is formed between the inter-layer insulating layers 22, and the sacrifice layer 237A is exposed in this air gap AG.

Figure 16:
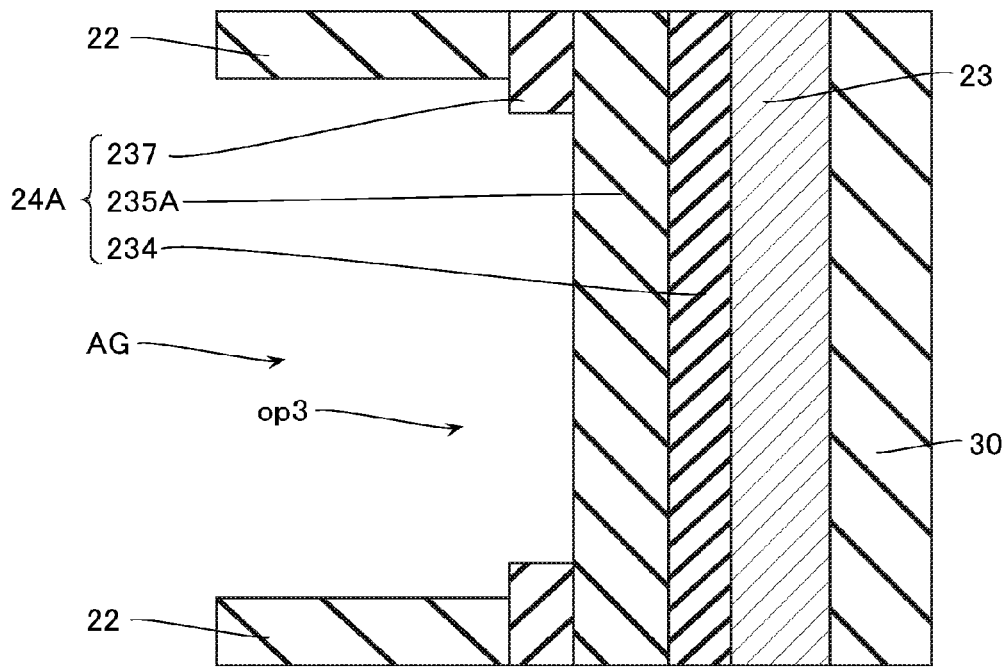
FIG. 16 is a schematic cross-sectional view showing a manufacturing process of the same nonvolatile semiconductor memory device.

Next, as shown in FIG. 16, the sacrifice layer 237A is partially removed via the opening op2 and the air gap AG, thereby forming the cover insulating layer 237 and an opening op3. As a result, as shown in FIG. 16, the charge accumulation layer formation layer 235A is exposed in the air gap AG between the inter-layer insulating layers 22. Note that removal of the sacrifice layer 237A is performed by, for example, wet etching using a hydrofluoric acid solution. Moreover, the inter-layer insulating layer 22 and the sacrifice layer 237A can both be formed from, for example, silicon oxide ($SiO_2$). In this case, not only the sacrifice layer 237A but also the inter-layer insulating layer 22 is partially removed.

Figure 17:
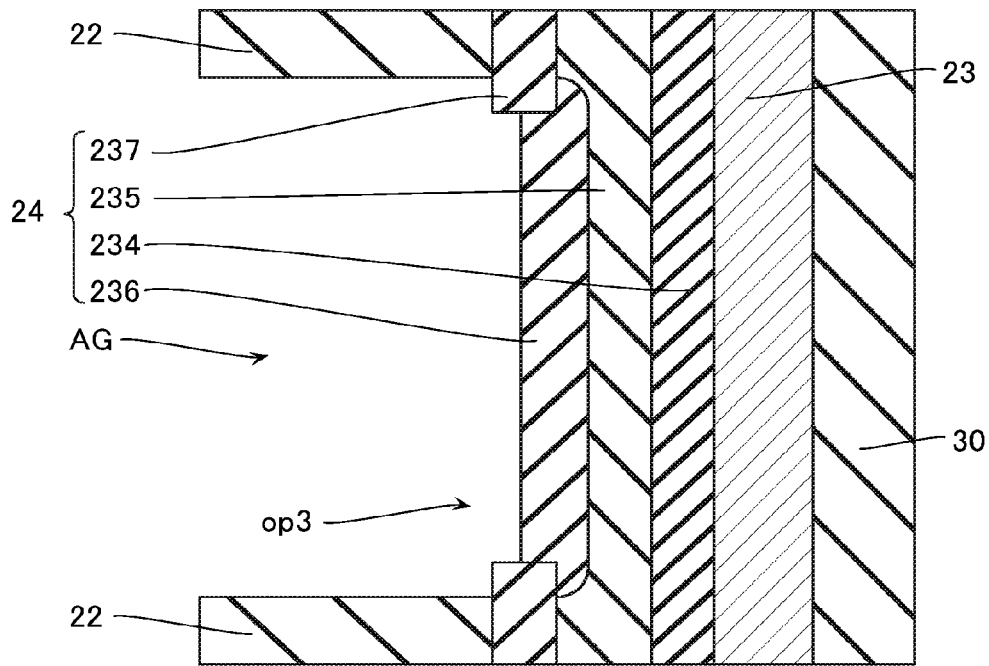
FIG. 17 is a schematic cross-sectional view showing a manufacturing process of the same nonvolatile semiconductor memory device.

Next, as shown in FIG. 17, an oxidation treatment is performed via the opening op2 and the air gap AG, a portion exposed in the air gap AG via the opening op3, of the charge accumulation layer formation layer 235A is oxidized, and the charge accumulation layer 235 and the block insulating layer 236 are formed. The oxidation treatment is performed by, for example, radical oxidation. Note that this oxidation treatment is performed to an extent that not all of the charge accumulation layer 235 is oxidized. As a result, the memory layer 24 is formed.

Figure 18:
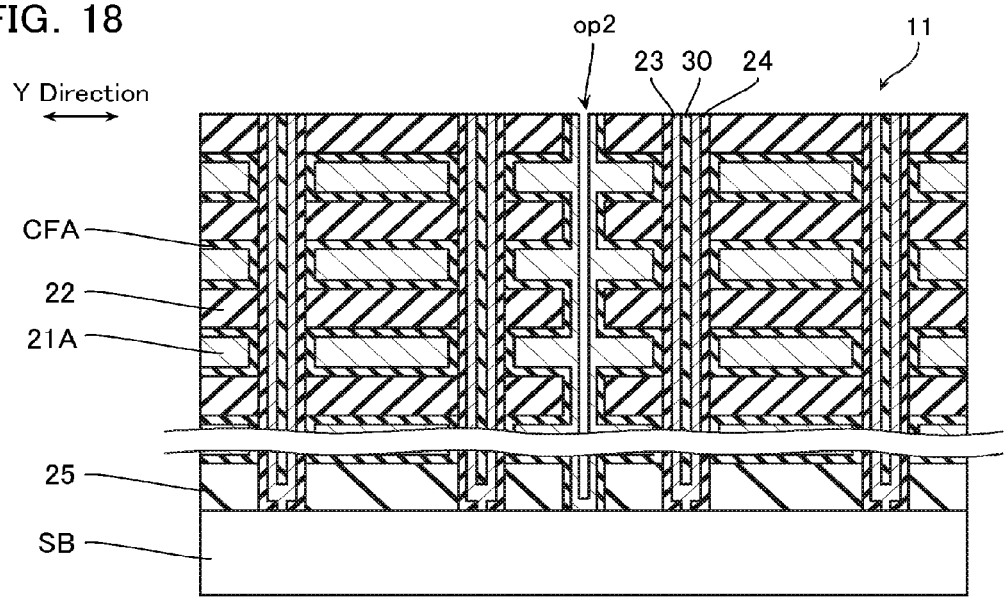
FIG. 18 is a schematic cross-sectional view showing a manufacturing process of the same nonvolatile semiconductor memory device.

Next, as shown in FIG. 18, a stacked film CFA which will be the stacked film CF and a conductive layer 21A which will be the conductive layer 21 (word line WL) are formed via the opening op2.

Subsequently, the stacked film CFA and the conductive layer 21A in the opening op2 are partially removed to form the stacked film CF and the conductive layer 21, and the inter-layer insulating layer LII and the source contact LI are formed, whereby the nonvolatile semiconductor memory device of the kind shown in FIGS. 4 and 5 is formed.

[Nonvolatile Semiconductor Memory Device According to Comparative Example]

Figure 19:
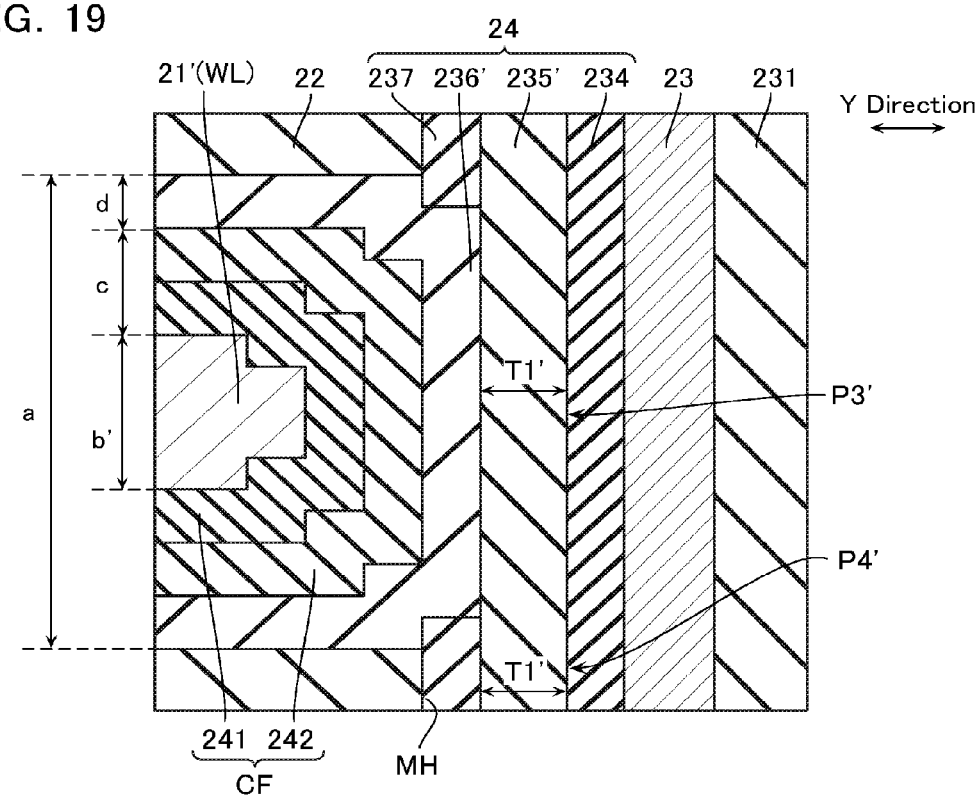
FIG. 19 is a schematic cross-sectional view showing a configuration of part of a nonvolatile semiconductor memory device according to a comparative example.

Next, a nonvolatile semiconductor memory device according to a comparative example will be described with reference to FIG. 19. FIG. 19 is a cross-sectional view for explaining the nonvolatile semiconductor memory device according to the comparative example.

As shown in FIG. 19, in the nonvolatile semiconductor memory device according to the comparative example, a portion P3' facing a conductive layer 21' of a charge accumulation layer 235' has a film thickness T1' of the same degree as that of a portion P4' facing the inter-layer insulating layer 22 of the charge accumulation layer 235'. Moreover, in the nonvolatile semiconductor memory device according to the comparative example, a block insulating layer 236' covers the side surface, upper surface, and lower surface of the word line WL via the side surface, upper surface, and lower surface of the stacked film CF.

Such a nonvolatile semiconductor memory device can be manufactured by, for example, performing processes similar to those of the method of manufacturing according to the present embodiment up to the process shown in FIG. 16, and forming the block insulating layer 236' by deposition, not the oxidation treatment.

[Comparison of Nonvolatile Semiconductor Memory Device According to Present Embodiment and Nonvolatile Semiconductor Memory Device According to Comparative Example]

As shown in FIG. 19, in a method of manufacturing according to the comparative example, the block insulating layer 236' is formed by deposition, and then the stacked film CF and the conductive layer 21' are formed by deposition. Therefore, the block insulating layer 236' covers the side surface, upper surface, and lower surface of the word line WL. Now, as shown in FIG. 19, assuming, for example, a width between two of the inter-layer insulating layers 22 adjacent in the stacking direction to be "a", a film thickness of the conductive layer 21' to be "b'", a film thickness of the stacked film CF to be "c", and a film thickness of the block insulating layer 36' to be "d", then the film thickness "b'" of the conductive layer 21' is "a−(2c+2d)".

In contrast, in the method of manufacturing according to the present embodiment, as shown in FIGS. 17 and 18, the block insulating layer 236 is formed by oxidation, and then the stacked film CFA which will be the stacked film CF and the conductive layer 21A which will be the conductive layer 21 (word line WL) are formed by deposition. Therefore, the block insulating layer 236 covers the side surface of the word line WL, and does not cover the upper surface and the lower surface of the word line WL. Now, as shown in FIG. 5, assuming, for example, a width between two of the inter-layer insulating layers 22 adjacent in the stacking direction to be "a", a film thickness of the conductive layer 21 to be "b", and a film thickness of the stacked film CF to be "c", then the film thickness "b" of the conductive layer 21 is "a−2c", and the conductive layer 21 can be formed thick.

That is, in the method of manufacturing according to the present embodiment, the block insulating layer 236 is formed by oxidation, hence the block insulating layer 236 is not formed between the inter-layer insulating layers 22, and the conductive layer 21 can be formed proportionately thicker. As a result, it is possible to increase the film thickness "b" of the word line WL to reduce the resistance value of the word line WL and improve operation speed, while suitably maintaining insulation properties between the word line WL and the charge accumulation layer 235. In addition, it is possible to reduce size in the stacking direction of the memory cell array 11, while suitably maintaining insulation properties between the word line WL and the charge accumulation layer 235.

Moreover, as mentioned above, the sacrifice layer 32 is formed from, for example, silicon nitride. In this case, sometimes, after the sacrifice layer 32 has been removed, residue, and so on, of the sacrifice layer 32 forms a charge trap, and impairs controllability of the nonvolatile semiconductor memory device. Now, as shown in FIG. 17, in the present embodiment, an oxidation treatment is performed after removing the sacrifice layer 32. Therefore, residue, and so on, of the sacrifice layer 32 is oxidized and the charge trap is removed, thereby making it possible to improve controllability of the nonvolatile semiconductor memory device.

In addition, by improving a fringe electric field and making it easier to form a channel in a portion P6 (FIG. 5) facing the inter-layer insulating layer 22 of the semiconductor layer 23, the method of manufacturing according to the present embodiment makes it possible to reduce read failure accompanying an increase in cell current.

[Second Embodiment]

Figure 20:
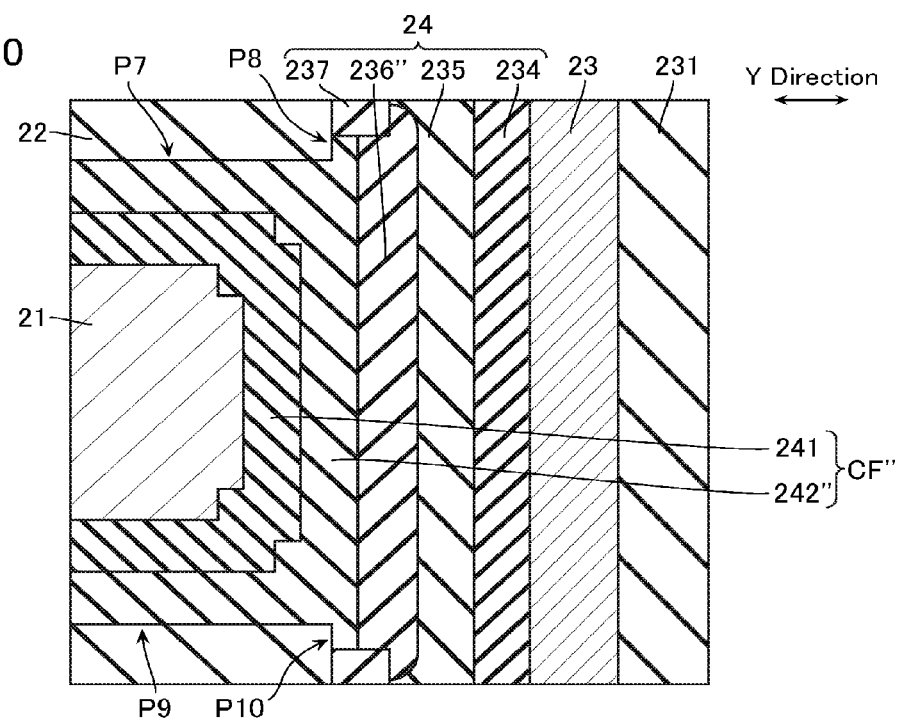
FIG. 20 is a schematic cross-sectional view showing a configuration of part of a nonvolatile semiconductor memory device according to a second embodiment.

Next, a second embodiment will be described with reference to FIG. 20. FIG. 20 is a cross-sectional view for explaining a nonvolatile semiconductor memory device according to the present embodiment. Note that in the description below, configurations similar to those in the first embodiment are assigned with reference symbols identical to those assigned in the first embodiment, and descriptions of said configurations will be omitted.

As shown in FIG. 20, the nonvolatile semiconductor memory device according to the present embodiment is configured substantially similarly to the nonvolatile semiconductor memory device according to the first embodiment, but differs from the first embodiment in the following points. First, in the present embodiment, an end of the cover insulating layer 237 is positioned upwardly or downwardly of, respectively, the upper surface or lower surface of the inter-layer insulating layer 22. Moreover, in the present embodiment, a block high dielectric layer 242" includes protruding portions P8 and P10 that respectively protrude upwardly and downwardly. That is, in the present embodiment, formed in a portion closest to the semiconductor layer 23, of an upper surface P7 of the block high dielectric layer 242" is a first protruding portion P8 that protrudes in the stacking direction. Moreover, formed in a portion closest to the semiconductor layer 23, of a lower surface P9 of the block high dielectric layer 242" is a second protruding portion P10 that protrudes in a reverse direction to the stacking direction. Therefore, it is possible to even further improve a fringe electric field and even further reduce read failure accompanying an increase in cell current, compared to in the first embodiment. Moreover, in the present embodiment, a block insulating layer 236" is formed in a broader range in the stacking direction, compared to the block insulating layer 236 according to the first embodiment.

Note that the nonvolatile semiconductor memory device according to the present embodiment can basically be manufactured by a method similar to the method of manufacturing according to the first embodiment, but in removal of the sacrifice layer 237A shown in FIG. 16, is manufactured by sufficiently increasing an etching rate of the sacrifice layer 237A over an etching rate of the inter-layer insulating layer 22 to remove the sacrifice layer 237A in a range which is larger than the width between two of the inter-layer insulating layers 22 adjacent in the stacking direction.

[Third Embodiment]

Figure 21:
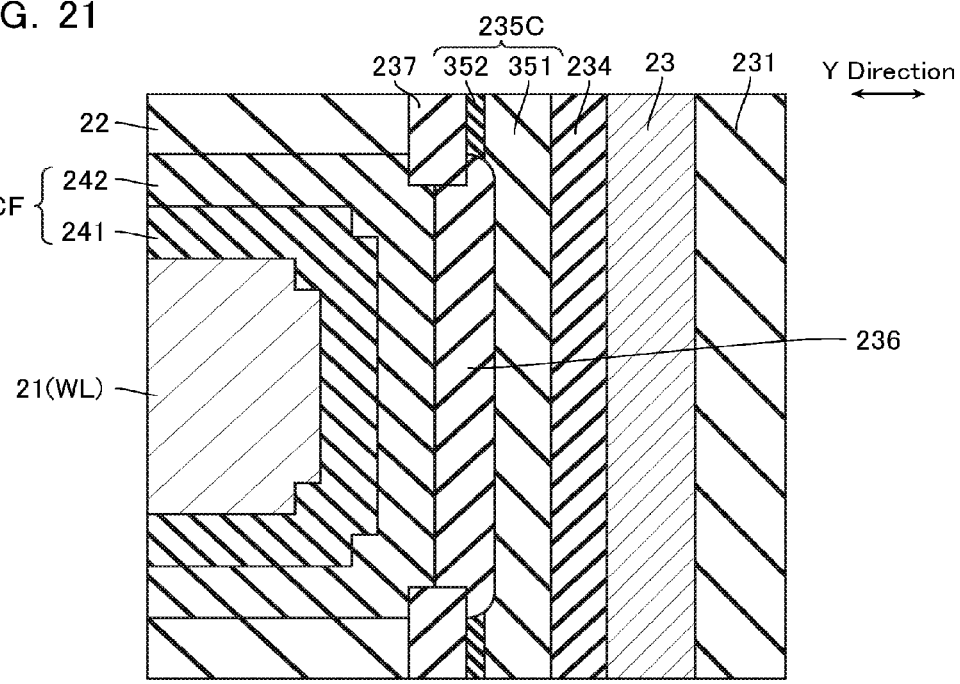
FIG. 21 is a schematic cross-sectional view showing a configuration of part of a nonvolatile semiconductor memory device according to a third embodiment.

Next, a third embodiment will be described with reference to FIG. 21. FIG. 21 is a cross-sectional view for explaining a nonvolatile semiconductor memory device according to the present embodiment. Note that in the description below, configurations similar to those in the first embodiment are assigned with reference symbols identical to those assigned in the first embodiment, and descriptions of said configurations will be omitted.

In the present embodiment, a charge accumulation layer 235C comprises: a silicon nitride layer 351 contacting the tunnel insulating layer 234; and a silicon oxynitride layer 352 contacting a portion facing the inter-layer insulating layer 22 of the silicon nitride layer 351. Note that in other respects, the nonvolatile semiconductor memory device according to the present embodiment is configured similarly to the nonvolatile semiconductor memory device according to the first embodiment.

Figure 22:
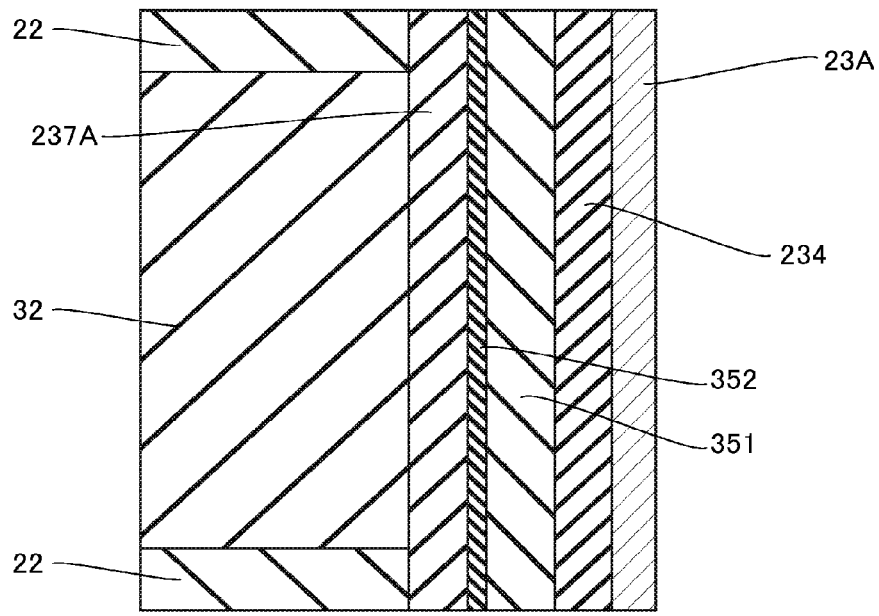
FIG. 22 is a schematic cross-sectional view showing a manufacturing process of the same nonvolatile semiconductor memory device.

Note that the nonvolatile semiconductor memory device according to the present embodiment can basically be manufactured by a method similar to the method of manufacturing according to the first embodiment, but as shown in FIG. 22, in the processes described with reference to FIGS. 8 and 9, is manufactured by sequentially stacking the silicon oxynitride layer 352 and the silicon nitride layer 351 after forming the sacrifice layer 237A, and then stacking the tunnel insulating layer 234 and the semiconductor layer formation layer 23A. Such a method makes it possible to more easily oxidize the silicon nitride layer 351 to form the block insulating layer 236.

[Fourth Embodiment]

Figure 23:
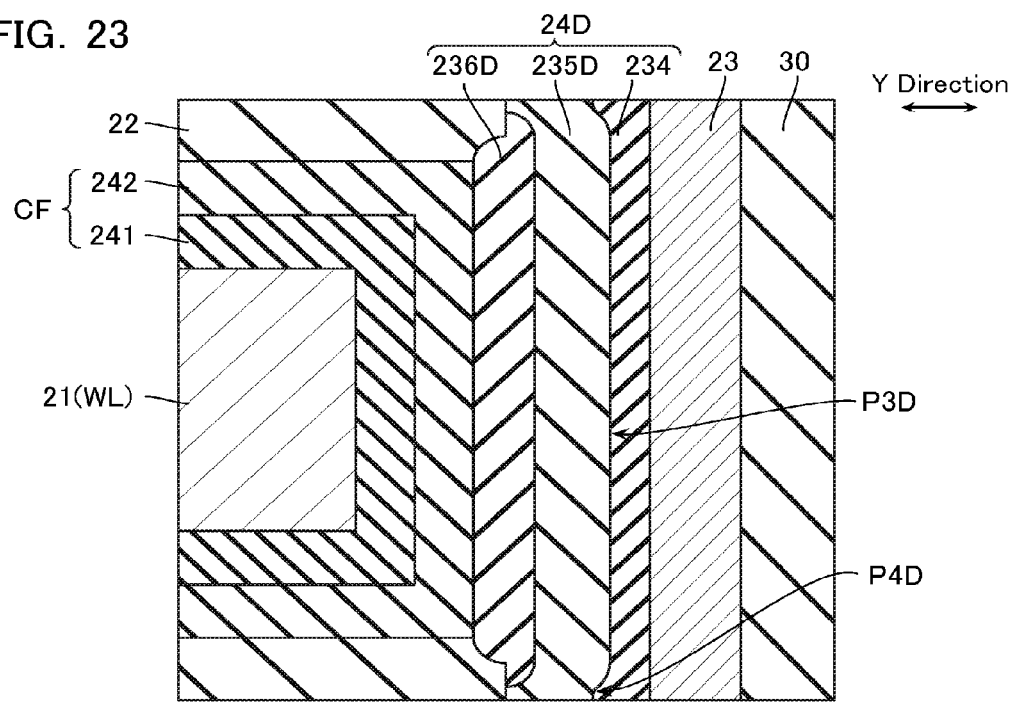
FIG. 23 is a schematic cross-sectional view showing a configuration of part of a nonvolatile semiconductor memory device according to a fourth embodiment.

Next, a fourth embodiment will be described with reference to FIGS. 23 to 30. FIG. 23 is a cross-sectional view for explaining a nonvolatile semiconductor memory device according to the present embodiment. Note that in the description below, configurations similar to those in the first embodiment are assigned with reference symbols identical to those assigned in the first embodiment, and descriptions of said configurations will be omitted.

As shown in FIG. 23, in the present embodiment, the cover insulating layer 237 (FIG. 5) is not provided, and the inter-layer insulating layer 22 contacts a charge accumulation layer 235D. Moreover, a portion P3D facing the conductive layer 21 of the charge accumulation layer 235D protrudes more in a direction that the core insulating layer 30 is disposed, compared to a portion P4D facing the inter-layer insulating layer 22 of the charge accumulation layer 235D.

Next, a method of manufacturing the nonvolatile semiconductor memory device according to the present embodiment will be described with reference to FIGS. 24 to 30. FIGS. 24 to 30 are cross-sectional views for explaining the method of manufacturing the nonvolatile semiconductor memory device according to the present embodiment.

The method of manufacturing the nonvolatile semiconductor memory device according to the present embodiment is performed similarly to in the first embodiment up to the process described with reference to FIG. 7.

Figure 24:
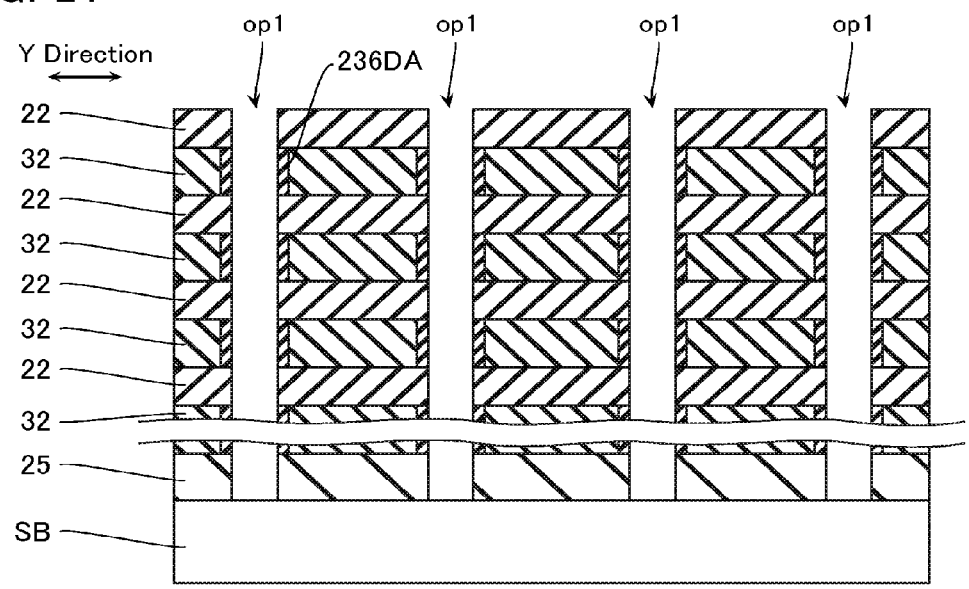
FIG. 24 is a schematic cross-sectional view showing a manufacturing process of the same nonvolatile semiconductor memory device.
Figure 25:
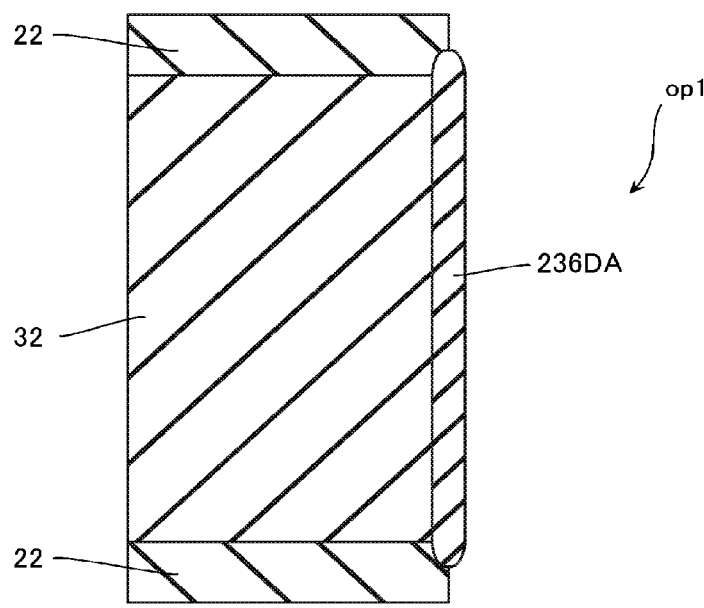
FIG. 25 is a schematic cross-sectional view showing a manufacturing process of the same nonvolatile semiconductor memory device.

Next, as shown in FIGS. 24 and 25, an oxidation treatment is performed, and a surface exposed in the opening op1 of the sacrifice layer 32 is oxidized to form an oxide layer 236DA which will be a block insulating layer 236D. The oxidation treatment is performed by, for example, radical oxidation. As shown in FIG. 25, the oxide layer 236DA protrudes into the opening op1, along with penetrating inside the sacrifice layer 32.

Figure 26:
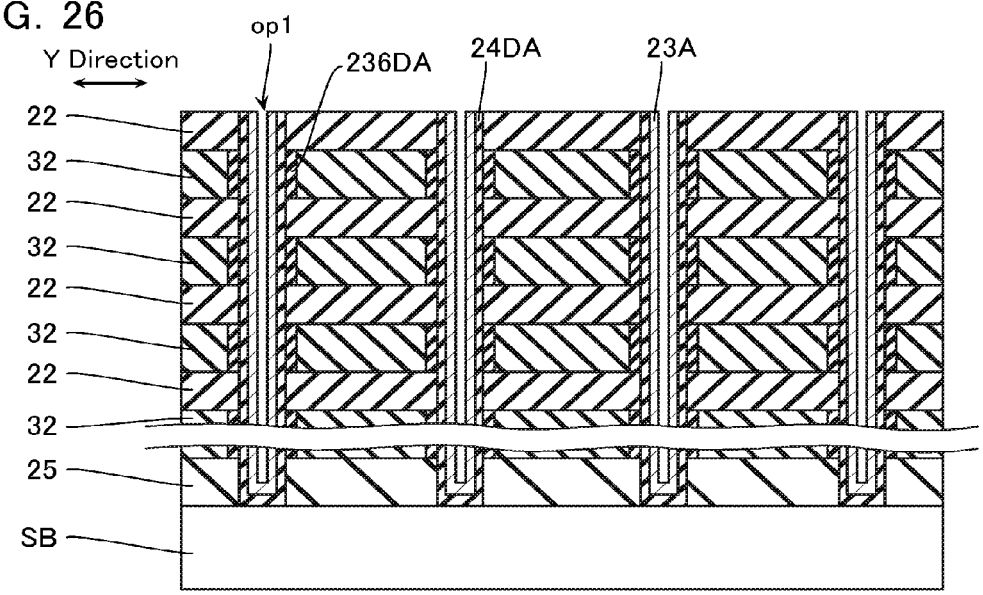
FIG. 26 is a schematic cross-sectional view showing a manufacturing process of the same nonvolatile semiconductor memory device.
Figure 27:
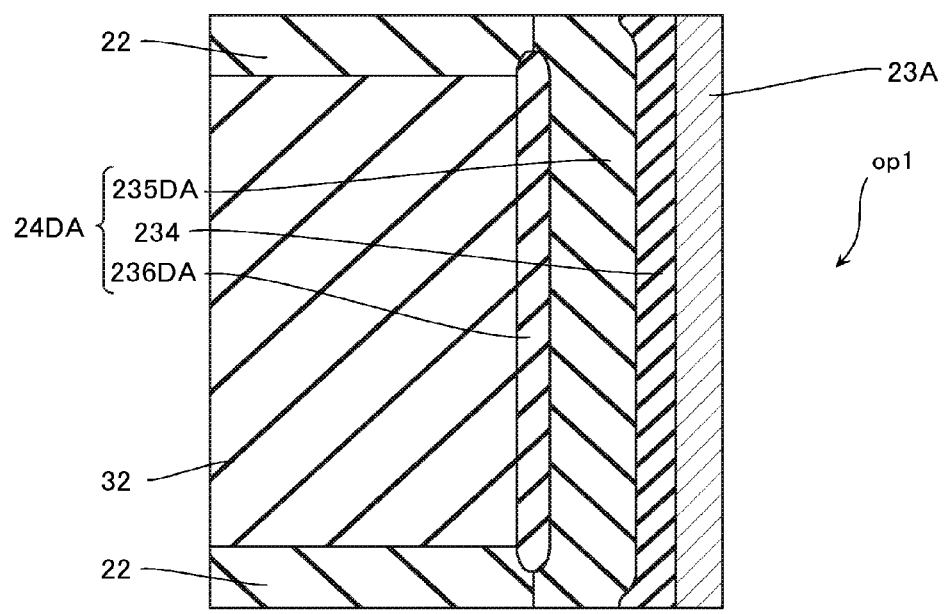
FIG. 27 is a schematic cross-sectional view showing a manufacturing process of the same nonvolatile semiconductor memory device.

Next, as shown in FIGS. 26 and 27, a memory layer formation layer 24DA and the semiconductor layer formation layer 23A are formed in the opening op1. As shown in FIG. 27, formation of the memory layer formation layer 24DA is performed by sequentially forming a charge accumulation layer formation layer 235DA which will be the charge accumulation layer 235D, and the tunnel insulating layer 234. That is, in the present embodiment, contrary to in the first embodiment, the sacrifice layer 237A (FIG. 9) is not formed. Note that the charge accumulation layer formation layer 235DA and the tunnel insulating layer 234 form an unevenness that accords with an unevenness formed by sidewalls of the oxide layer 236DA and the inter-layer insulating layer 22.

Next, processes similar to the processes described with reference to FIGS. 10 to 12 are performed, and the semiconductor layer 23 and the core insulating layer 30 are formed. Moreover, a process similar to the process described with reference to FIG. 13 is performed, and the opening op2 is formed.

Figure 28:
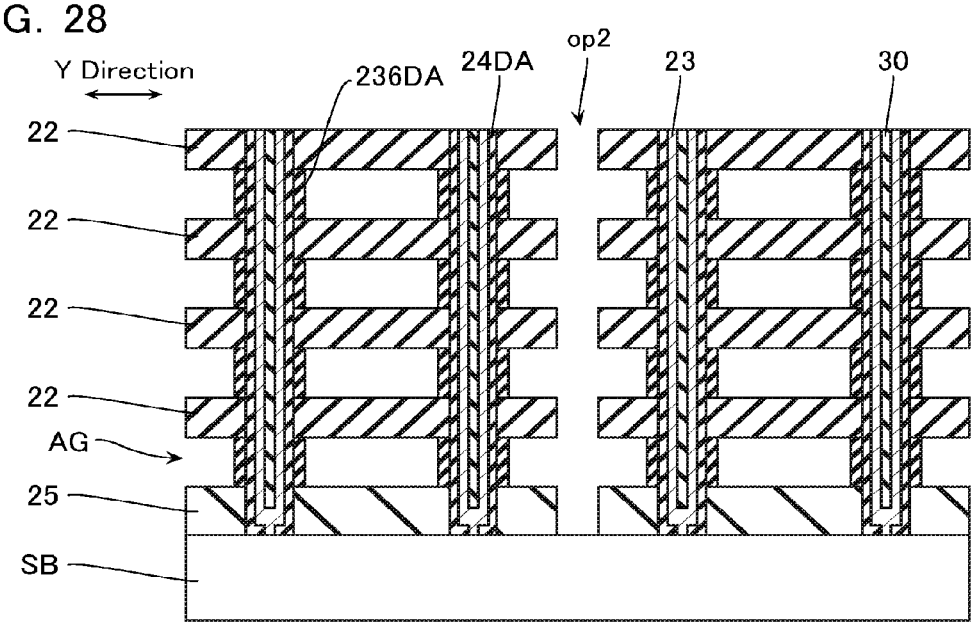
FIG. 28 is a schematic cross-sectional view showing a manufacturing process of the same nonvolatile semiconductor memory device.
Figure 29:
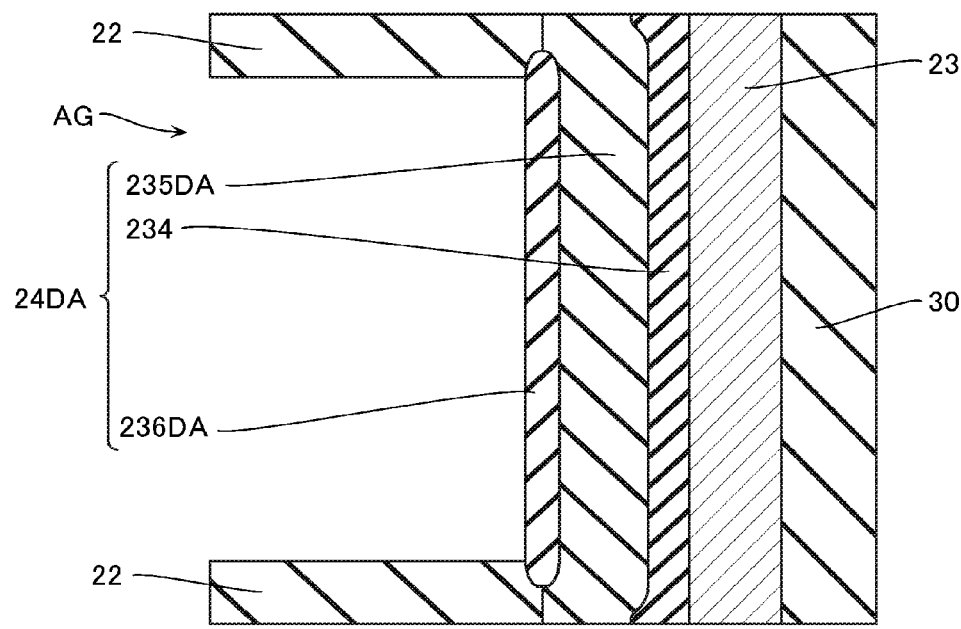
FIG. 29 is a schematic cross-sectional view showing a manufacturing process of the same nonvolatile semiconductor memory device.

Next, as shown in FIGS. 28 and 29, the sacrifice layer 32 is removed via the opening op2, and the air gap AG is formed. Removal of the sacrifice layer 32 is performed substantially similarly to in the processes described with reference to FIGS. 14 and 15. However, in the present embodiment, the oxide layer 236DA is left between the inter-layer insulating layers 22.

Figure 30:
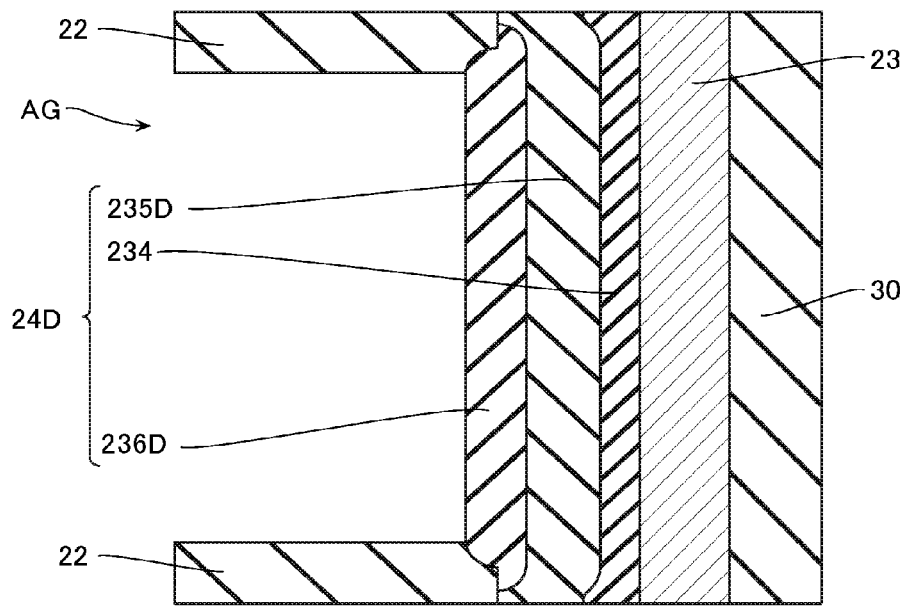
FIG. 30 is a schematic cross-sectional view showing a manufacturing process of the same nonvolatile semiconductor memory device.

Next, as shown in FIG. 30, an oxidation treatment is performed via the opening op2 and the air gap AG, a portion contacting the oxide layer 236DA, of the charge accumulation layer formation layer 235DA is oxidized, and the block insulating layer 236D and the charge accumulation layer 235D are formed. This oxidation treatment is performed substantially similarly to in the process described with reference to FIG. 17.

Subsequently, the process described with reference to FIG. 18 and following processes are performed similarly to in the first embodiment, whereby the nonvolatile semiconductor memory device according to the present embodiment is formed.

In the present embodiment, as shown in FIGS. 24 and 25, the oxide layer 236DA is formed by the oxidation treatment. This oxide layer 236DA protects the memory layer formation layer 24DA, the semiconductor layer 23, and the core insulating layer 30 formed inside the opening op1, when removing the sacrifice layer 32. Now, the oxide layer 236DA formed by oxidation has a stronger etching tolerance compared to the sacrifice layer 237A (FIG. 9) formed by deposition. Therefore, in the processes described with reference to FIGS. 28 and 29, selection ratio of etching can be improved, and the sacrifice layer 32 can be suitably removed.

Moreover, in the present embodiment, because the semiconductor layer 23 and the core insulating layer 30 are protected by the oxide layer 236DA formed by oxidation, there is no need to provide the sacrifice layer 237A (FIG. 9) inside the opening op1 in the processes shown in FIGS. 26 and 27. Therefore, it is possible to reduce a radius of the opening op1 to achieve further miniaturization of the nonvolatile semiconductor memory device.

Moreover, in the processes described in FIGS. 8 to 12, each of the layers is gradually stacked in the opening op1, hence there is a risk that hole diameter gradually narrows and clogging ends up occurring. Now, in the present embodiment, the sacrifice layer 237A (FIG. 9) is not provided inside the opening op1, hence hole diameter can be made comparatively large, and occurrence of such clogging can be suppressed.

[Other Embodiments]

Figure 31:
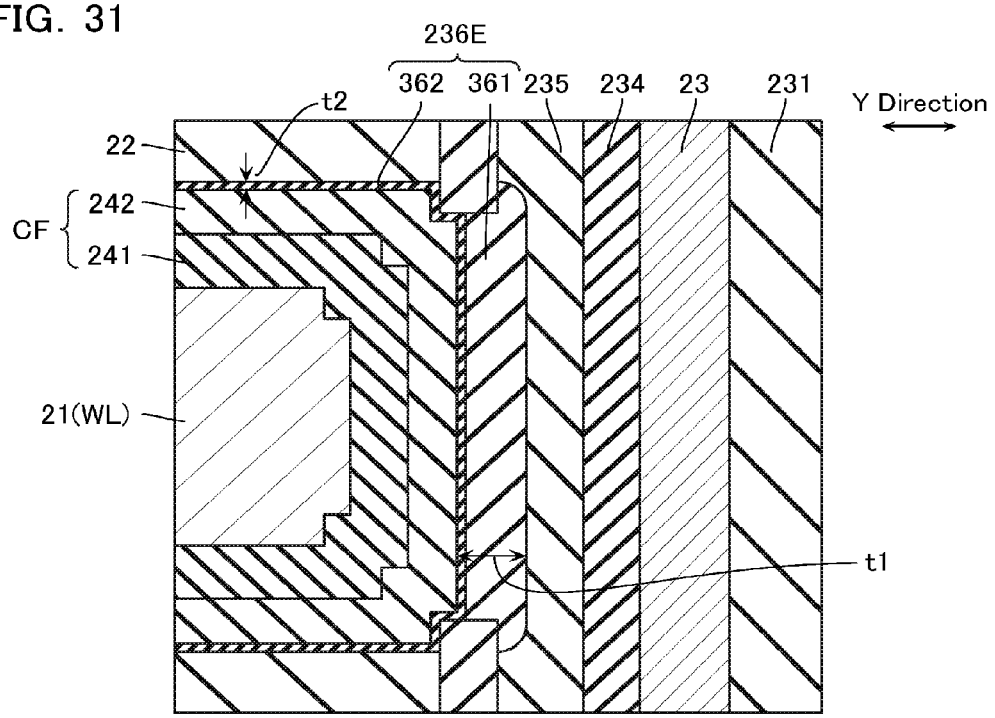
FIG. 31 is a schematic cross-sectional view showing a configuration of part of a nonvolatile semiconductor memory device according to another embodiment.

As shown in FIG. 5, in the nonvolatile semiconductor memory device according to the first embodiment, the block insulating layer between the conductive layer 21 and the inter-layer insulating layer 22 is omitted, whereby the film thickness b of the conductive layer 21 between two of the inter-layer insulating layers 22 adjacent in the stacking direction is increased. However, as shown in, for example, FIG. 31, it is possible to combine use of an insulating layer 361 formed by oxidation and an insulating layer 362 formed by deposition to configure a block insulating layer 236E. In this case also, a film thickness t2 of the insulating layer 362 between the stacked film CF and the inter-layer insulating layer 22 becomes thinner compared to a film thickness t1 of the block insulating layer 236E between the conductive layer 21 and the charge accumulation layer 235. Therefore, the film thickness of the conductive layer 21 can be more increased compared to in the comparative example of the kind shown in, for example, FIG. 19.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a plurality of conductive layers stacked in a first direction via an inter-layer insulating layer;
    a semiconductor layer having the first direction as a longer direction;
    a tunnel insulating layer contacting a side surface of the semiconductor layer;
    a charge accumulation layer contacting a side surface of the tunnel insulating layer; and a block insulating layer contacting a portion facing the conductive layer, of a side surface of the charge accumulation layer, the charge accumulation layer including:
a first portion facing the conductive layer and extending in the first direction, and
a second portion facing the inter-layer insulating layer and extending in the first direction,
the first portion being thinner than the second portion, and
a film thickness of the second portion of the charge accumulation layer in a second direction crossing the first direction being approximately constant.

2. The nonvolatile semiconductor memory device according to claim 1, wherein the block insulating layer covers a side surface of the conductive layer, and does not cover an upper surface and a lower surface of the conductive layer.

3. The nonvolatile semiconductor memory device according to claim 1, further comprising a stacked film covering the conductive layer, wherein the stacked film
contacts the inter-layer insulating layer at an upper surface and a lower surface, and
contacts the block insulating layer at a side surface facing the semiconductor layer.

4. The nonvolatile semiconductor memory device according to claim 3, wherein
the stacked film comprises a high-k dielectric insulating layer, and
the high-k dielectric insulating layer includes a protruding portion protruding in the first direction, on an upper surface and a lower surface of the high-k dielectric insulating layer.

5. The nonvolatile semiconductor memory device according to claim 1, wherein the charge accumulation layer comprises:
a silicon nitride layer contacting the tunnel insulating layer; and
a silicon oxynitride layer contacting a portion facing the inter-layer insulating layer, of the silicon nitride layer.

6. The nonvolatile semiconductor memory device according to claim 1, wherein the inter-layer insulating layer contacts the charge accumulation layer.

7. The nonvolatile semiconductor memory device according to claim 1, further comprising:
a stacked film covering the conductive layer, wherein the stacked film comprises a high-k dielectric insulating layer, and
an insulating layer contacting the high-k dielectric insulating layer and the inter-layer insulating layer is provided.

8. A method of manufacturing the nonvolatile semiconductor memory device according to claim 1, comprising:
alternately stacking a plurality of inter-layer insulating layers and a plurality of first sacrifice layers;
forming a memory hole penetrating the plurality of inter-layer insulating layers and the plurality of first sacrifice layers;
sequentially forming the charge accumulation layer, the tunnel insulating layer, and the semiconductor layer on a sidewall of the memory hole;
removing the plurality of first sacrifice layers;
oxidizing part of the charge accumulation layer to form the block insulating layer; and
forming a conductive layer between the plurality of inter-layer insulating layers.

9. The method of manufacturing a nonvolatile semiconductor memory device according to claim 8, further comprising:

before forming the charge accumulation layer on the sidewall of the memory hole, forming a second sacrifice layer on the sidewall of the memory hole; and
after removing the first sacrifice layer and before oxidizing part of the charge accumulation layer to form the block insulating layer, removing the second sacrifice layer.

10. The method of manufacturing a nonvolatile semiconductor memory device according to claim 9, further comprising:
after forming the block insulating layer and before forming the conductive layer, forming an additional block layer covering an upper surface and lower surface of the inter-layer insulating layer and a side surface of the block insulating layer.

11. The method of manufacturing a nonvolatile semiconductor memory device according to claim 10, further comprising:
when removing the second sacrifice layer, removing the second sacrifice layer in a range larger than a width between two inter-layer insulating layers adjacent in a stacking direction; and
when forming the additional block layer, forming a high dielectric insulating layer covering the side surface of the block insulating layer.

12. The method of manufacturing a nonvolatile semiconductor memory device according to claim 8, further comprising
when forming the charge accumulation layer, sequentially forming a silicon oxynitride layer and a silicon nitride layer.

13. The method of manufacturing a nonvolatile semiconductor memory device according to claim 8, further comprising:
after forming the memory hole, oxidizing the first sacrifice layer exposed inside the memory hole to form an oxide layer; and
forming the charge accumulation layer on a sidewall of the inter-layer insulating layer and a sidewall of the oxide layer.

14. A nonvolatile semiconductor memory device, comprising:
a plurality of conductive layers stacked in a first direction via an inter-layer insulating layer;
a semiconductor layer having the first direction as a longer direction;
a tunnel insulating layer contacting a side surface of the semiconductor layer;
a charge accumulation layer contacting a side surface of the tunnel insulating layer; and
a block insulating layer contacting a portion facing the conductive layer, of a side surface of the charge accumulation layer,
the charge accumulation layer including:
a first portion facing the conductive layer and extending in the first direction; and
a second portion facing the inter-layer insulating layer and extending in the first direction,
the first portion being thinner than the second portion, and
a side surface of the second portion being flush with the first direction.

15. The nonvolatile semiconductor memory device according to claim 14, wherein the block insulating layer covers a side surface of the conductive layer, and does not cover an upper surface and a lower surface of the conductive layer.

16. The nonvolatile semiconductor memory device according to claim 14, further comprising a stacked film covering the conductive layer, wherein the stacked film:
- contacts the inter-layer insulating layer at an upper surface and a lower surface, and
- contacts the block insulating layer at a side surface facing the semiconductor layer.

17. The nonvolatile semiconductor memory device according to claim 16, wherein
- the stacked film comprises a high-k dielectric insulating layer, and
- the high-k dielectric insulating layer includes a protruding portion protruding in the first direction, on an upper surface and a lower surface of the high-k dielectric insulating layer.

18. The nonvolatile semiconductor memory device according to claim 14, wherein the charge accumulation layer comprises:
- a silicon nitride layer contacting the tunnel insulating layer; and
- a silicon oxynitride layer contacting a portion facing the inter-layer insulating layer, of the silicon nitride layer.

19. The nonvolatile semiconductor memory device according to claim 14, wherein the inter-layer insulating layer contacts the charge accumulation layer.

20. The nonvolatile semiconductor memory device according to claim 14, further comprising:
- a stacked film covering the conductive layer, wherein the stacked film comprises a high-k dielectric insulating layer; and
- an insulating layer contacting the high-k dielectric insulating layer and the inter-layer insulating layer is provided.

* * * * *